(12) United States Patent
Kim et al.

(10) Patent No.: US 12,041,739 B2
(45) Date of Patent: Jul. 16, 2024

(54) ELECTRONIC DEVICE AND MANUFACTURING METHOD OF THE SAME

(71) Applicant: SAMSUNG DISPLAY CO., LTD., Yongin-si (KR)

(72) Inventors: Byeong-Beom Kim, Yongin-si (KR); Seung Kim, Yongin-si (KR); Seungho Kim, Yongin-si (KR); Cheolmin Park, Yongin-si (KR); Hyunchul Bae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/352,594

(22) Filed: Jul. 14, 2023

(65) Prior Publication Data
US 2024/0049414 A1 Feb. 8, 2024

(30) Foreign Application Priority Data
Aug. 8, 2022 (KR) .......... 10-2022-0098815

(51) Int. Cl.
| | |
|---|---|
| H05K 5/03 | (2006.01) |
| C03C 15/00 | (2006.01) |
| C03C 17/00 | (2006.01) |
| C03C 17/23 | (2006.01) |
| C03C 27/10 | (2006.01) |
| G03F 7/00 | (2006.01) |

(52) U.S. Cl.
CPC ............ *H05K 5/03* (2013.01); *C03C 15/00* (2013.01); *C03C 17/002* (2013.01); *C03C 17/23* (2013.01); *C03C 27/10* (2013.01); *G03F 7/0007* (2013.01); *C03C 2217/78* (2013.01); *C03C 2218/33* (2013.01); *C03C 2218/34* (2013.01)

(58) Field of Classification Search
CPC ...................................................... H05K 5/03
See application file for complete search history.

(56) References Cited

U.S. PATENT DOCUMENTS

| | | |
|---|---|---|
| 9,507,191 B2 | 11/2016 | Park et al. |
| 10,730,781 B2 | 8/2020 | Kubler et al. |
| 2013/0127202 A1 | 5/2013 | Hart |

FOREIGN PATENT DOCUMENTS

| | | |
|---|---|---|
| EP | 3448821 | 12/2019 |
| KR | 10-2014-0096145 | 8/2014 |
| KR | 10-2215054 | 2/2021 |
| KR | 10-2369002 | 2/2022 |

*Primary Examiner* — Ian A Rummel
(74) *Attorney, Agent, or Firm* — CHAU & ASSOCIATES, LLC

(57) ABSTRACT

An electronic device includes a display module that includes a foldable display portion and a non-foldable display portion, and a window disposed above the display module and that includes a foldable portion that corresponds to the foldable display portion and a non-foldable portion that corresponds to the non-foldable display portion. The window includes a first glass substrate, a second glass substrate that faces the first glass substrate, a protection layer that corresponds to the non-foldable portion and that is disposed between the first glass substrate and the second glass substrate and that includes an inorganic oxide, and a photoresist layer disposed between the protection layer and the first glass substrate. The first glass substrate includes a recessed portion that corresponds to the foldable portion formed on one surface adjacent to the protection layer.

20 Claims, 18 Drawing Sheets

ELECTRONIC DEVICE AND MANUFACTURING METHOD OF THE SAME

CROSS-REFERENCE TO RELATED APPLICATIONS

This U.S. non-provisional patent application claims priority under 35 U.S.C. § 119 from Korean Patent Application No. 10-2022-0098815, filed on Aug. 8, 2022 in the Korean Intellectual Property Office, the contents of which are herein incorporated by reference in their entirety.

TECHNICAL FIELD

Embodiments of the present disclosure herein are directed to an electronic device that includes a window and a method of manufacturing the same, and more particularly, to an electronic device that includes a foldable window and a method of manufacturing the same.

DISCUSSION OF THE RELATED ART

Various types of electronic devices are used to provide image information, and recently, electronic devices that include a foldable or bendable flexible display panel have been developed. Unlike a rigid electronic device, the shape of a flexible electronic device can be changed and a flexible electronic device can be folded, rolled, or bent so that it can be easily carried regardless of the size of a display screen.

Such a flexible electronic device uses a window to protect the display panel without interfering with the folding or bending operation, and accordingly, a window should have excellent mechanical properties while maintaining good folding properties.

SUMMARY

Embodiments of the present disclosure provide an electronic device that has good folding properties and high impact resistance.

Embodiments of the present disclosure also provide a method of manufacturing an electronic device that has good folding properties and high impact resistance.

An embodiment of the inventive concept provides an electronic device that includes a display module that includes a foldable display portion that is foldable with respect to a folding axis that extends in a first direction, and a first non-foldable display portion and a second non-foldable display portion spaced apart from each other in a second direction perpendicular to the first direction with the foldable display portion interposed therebetween, and a window disposed above the display module and that includes a foldable portion that corresponds to the foldable display portion and a non-foldable portion that includes a first non-foldable portion and a second non-foldable portion that respectively corresponds to the first non-foldable display portion and the second non-foldable display portion. The window includes a first glass substrate, a second glass substrate disposed on the first glass substrate, a protection layer that corresponds to the non-foldable portion and that is disposed between the first glass substrate and the second glass substrate and includes an inorganic oxide, and a photoresist layer disposed between the protection layer and the first glass substrate. The first glass substrate includes a recessed portion formed on one surface adjacent to the protective layer and that corresponds to the foldable portion.

In an embodiment, the inorganic oxide includes $Al_2O_3$.

In an embodiment, a thickness of the protection layer is 10000 μm or less.

In an embodiment, a ratio of a transmittance of the protective layer to a transmittance of the first glass substrate is within a range of from 100:99 to 100:101.

In an embodiment, a thickness of a portion of the first glass substrate that corresponds to the foldable portion is about 20 μm to about 100 μm.

In an embodiment, a thickness of a portion of the first glass substrate that corresponds to the non-foldable portion is about 50 μm to about 300 μm.

In an embodiment, a width of a portion that corresponds to the foldable portion in the second direction is about 20 mm or less.

In an embodiment, one surface of the second glass substrate adjacent to the first glass substrate is flat.

In an embodiment of the inventive concept, an electronic device includes a display module that includes a foldable display portion that is foldable with respect to a folding axis that extends in a first direction, and a first non-foldable display portion and a second non-foldable display portion that are spaced apart from each other in a second direction perpendicular to the first direction with the foldable display portion interposed therebetween; and a window disposed above the display module and that includes a foldable portion that corresponds to the foldable display portion and a non-foldable portion that includes a first non-foldable portion and a second non-foldable portion that respectively correspond to the first non-foldable display portion and the second non-foldable display portion. The window includes a first glass substrate disposed on the display module and that includes a first portion that corresponds to the foldable portion and that has a first thickness and a second portion that corresponds to the non-foldable portion and that has a second thickness greater than the first thickness, a second glass substrate that faces the first glass substrate; and a protection layer disposed between the first glass substrate and the second glass substrate and that has a thickness of about 10000 μm or less and includes an inorganic oxide.

In an embodiment, the inorganic oxide includes $Al_2O_3$.

In an embodiment, the protection layer does not overlap the first portion and overlaps the second portion.

In an embodiment, the window further includes a photoresist layer disposed on the protection layer.

In an embodiment, the photoresist layer further includes an adhesive component.

In an embodiment, the protection layer does not overlap the second portion and overlaps the first portion.

In an embodiment, a width of the foldable portion in the second direction is about 20 mm or less.

In an embodiment, the first thickness is about 20 μm to about 100 μm, and the second thickness is about 50 μm to about 300 μm.

In an embodiment, a ratio of a transmittance of the protective layer to a transmittance of the first glass substrate is within a range of from 100:99 to 100:101.

In an embodiment of the inventive concept, a method for manufacturing an electronic device includes providing a display module that includes a foldable display portion that is foldable with respect to a folding axis that extends in a first direction and a first non-foldable display portion and a second non-foldable display portion that are spaced apart from each other in a second direction perpendicular to the first direction with the foldable display portion interposed therebetween; and disposing a window on the display module. The window includes a foldable portion disposed above the display module and that corresponds to the foldable display portion and a non-foldable portion that includes a first non-foldable portion and a second non-foldable portion that respectively correspond to the first non-foldable display portion and the second non-foldable display portion. Providing the window includes providing a preliminary first glass substrate, disposing a protection layer that includes an inorganic oxide on the preliminary first glass substrate; disposing a photoresist layer on the protection layer; irradiating light on a portion of the photoresist layer that corresponds to the foldable portion wherein an opening is formed in the photoresist layer; etching a portion of the protection layer that is exposed by the photoresist layer with a first gas; etching a portion of the preliminary first glass substrate that is exposed by the photoresist layer with a second gas and producing a first glass substrate, and disposing a second glass substrate on the photoresist layer.

In an embodiment, the inorganic oxide includes $Al_2O_3$.

In an embodiment, providing the second glass substrate on the first glass substrate includes a step in which the photoresist layer bonds the first glass substrate and the second glass substrate to each other.

DETAILED DESCRIPTION

Figure 1A:
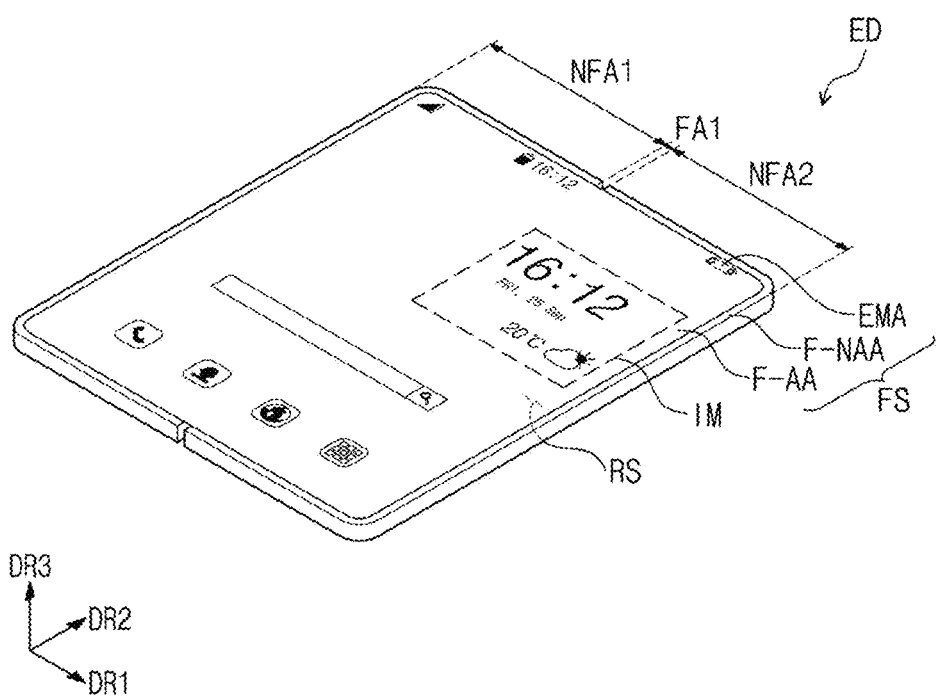
FIG. 1A is a perspective view of an unfolded electronic device according to an embodiment of the inventive concept.

In this specification, it will be understood that when an element (or region, layer, part, etc.) is referred to as being "on", "connected to" or "coupled to" another element, it can be directly on, connected or coupled to the other element, or intervening elements may be present.

Like reference numerals may refer to like elements throughout.

The term "about" as used herein is inclusive of the stated value and means within an acceptable range of deviation for the particular value as determined by one of ordinary skill in the art, considering the measurement in question and the error associated with measurement of the particular quantity, such as the limitations of the measurement system. For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Hereinafter, a window according to an embodiment of the inventive concept and an electronic device according to an embodiment of the inventive concept will be described with reference to the accompanying drawings.

Figure 1B:
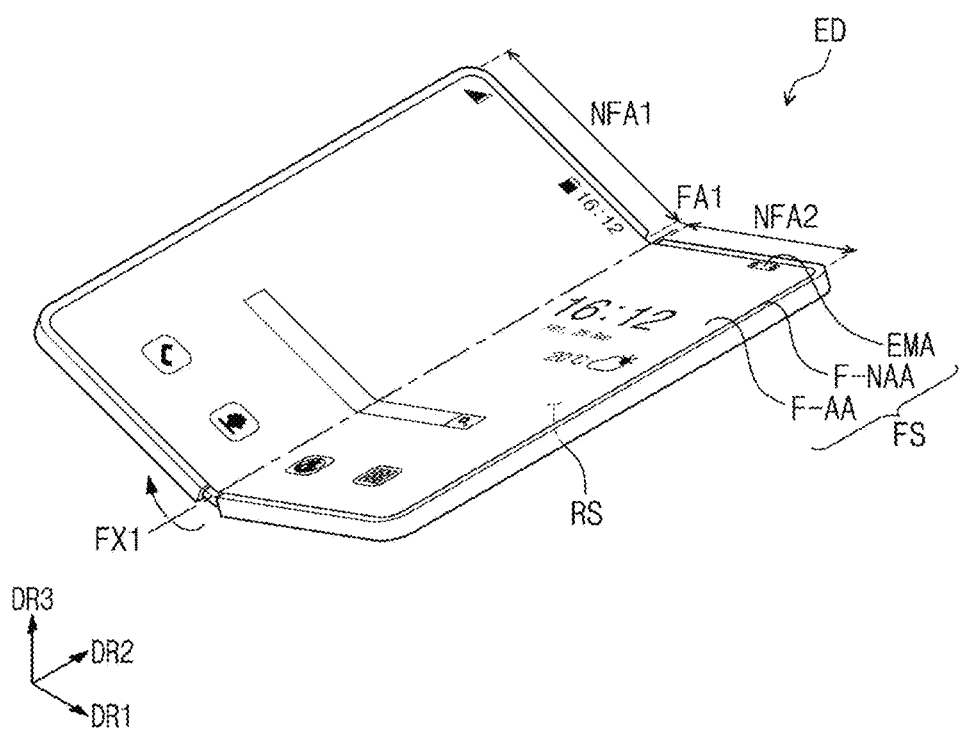
FIG. 1B illustrates an in-folding process of an electronic device according to an embodiment illustrated in FIG. 1A.
Figure 1C:
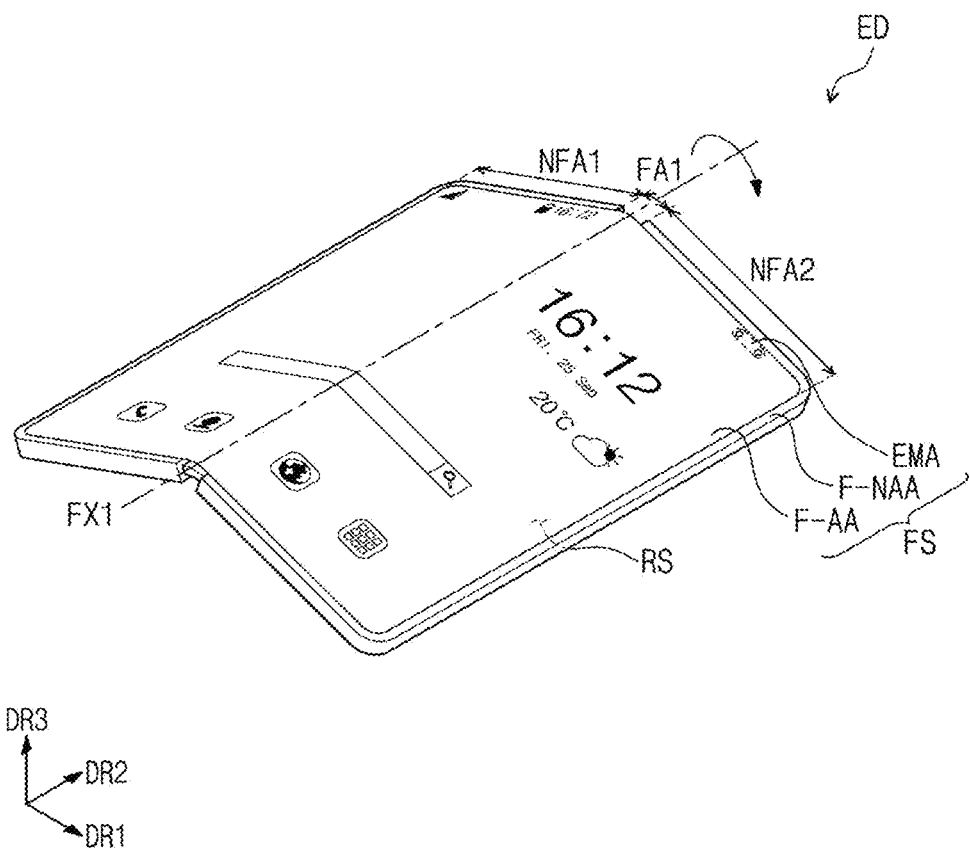
FIG. 1C illustrates an out-folding process of an electronic device according to an embodiment illustrated in FIG. 1A.

FIG. 1A is a perspective view of an unfolded electronic device according to an embodiment of the inventive concept. FIG. 1B illustrates an in-folding process of an electronic device according to an embodiment illustrated in FIG. 1A. FIG. 1C illustrates an out-folding process of an electronic device according to an embodiment illustrated in FIG. 1A.

An electronic device ED according to an embodiment of the inventive concept can be activated by an electrical signal. For example, the electronic device ED is one of a mobile phone, a tablet, a car navigation system, a game machine, or a wearable device, but embodiments of the inventive concept are not necessarily limited thereto. In this specification, the figures exemplarily illustrate the electronic device ED as a mobile phone.

Referring to FIGS. 1A to 1C, the electronic device ED according to an embodiment of the inventive concept includes a first display surface FS that is parallel to a plane defined by a first direction axis DR1 and a second direction axis DR2 that crosses the first direction axis DR1. The electronic device ED displays an image IM to a user through the first display surface FS. The electronic device ED according to an embodiment of the inventive concept displays the image IM toward a third direction axis DR3 that is perpendicular to each of the first direction axis DR1 and the second direction axis DR2. In this specification, the front surface (or upper surface) and the rear surface (or lower surface) of each member are defined based on a direction in which the image IM is displayed. The front surface and the rear surface may be opposite to each other in the third direction axis DR3, and the normal direction of each of the front surface and the rear surface is parallel to the third direction axis DR3.

The electronic device ED according to an embodiment of the inventive concept includes a first display surface FS and a second display surface RS. The first display surface FS includes an active region F-AA and a peripheral region F-NAA. The active region F-AA include an electronic module region EMA. The second display surface RS is opposite to at least a portion of the first display surface FS. For example, the second display surface RS is a portion of the rear surface of the electronic device ED.

The electronic device ED according to an embodiment of the inventive concept can sense an externally applied input. The externally applied input may be at least one various types of inputs received from outside of the electronic device ED. For example, the external input may include an external input, such as hovering, applied at a place close to or at a predetermined adjacent distance from the electronic device ED as well as a touch by a body part, such as a user's hand. In addition, the external input can have various forms, such as force, pressure, temperature, and/or light.

FIG. 1A and the following drawings illustrate the first to third direction axes DR1, Dr2, and DR3. However, the directions indicated by the first, to third direction axes DR1, DR2, and DR3 are relative concepts and may be converted into other directions. In addition, the directions indicated by the first to third direction axes DR1, DR2, and DR3 are described as first to third directions, for which the same reference numerals may be used.

The active region F-AA of the electronic device ED is activated by an electrical signal. The electronic device ED according to an embodiment of the inventive concept displays an image IM through the active region F-AA. In addition, various types of external inputs can be sensed in the active region F-AA. The peripheral region F-NAA is adjacent to the active region F-AA. The peripheral region F-NAA has a predetermined color. The peripheral region F-NAA surrounds the active region F-AA. Accordingly, the shape of the active region F-AA is substantially defined by the peripheral region F-NAA. However, embodiments are not necessarily limited thereto, and in other embodiments, the peripheral region F-NAA is disposed adjacent to only one side of the active region F-AA, or is omitted. The active region F-AA of the electronic device ED according to an embodiment of the inventive concept may i have one of various shapes, and the shape is not necessarily limited to any one embodiment.

The electronic device ED includes a foldable region FA1 and non-foldable regions NFA1 and NFA2. In an embodiment of the inventive concept, the non-foldable regions NFA1 and NFA2 are disposed adjacent to the foldable region FA1 with the foldable region FA1 interposed therebetween. The electronic device ED according to an embodiment of the inventive concept includes a first non-foldable region NFA1 and a second non-foldable region NFA2 that are spaced apart from each other in the direction of the first direction axis DR1 with the foldable region FA1 interposed therebetween. For example, the first non-folding region NFA1 is disposed on one side of the foldable region FA1 in the first direction DR1, and the second non-foldable region NFA2 is disposed on the other side of the folding region FA1 in the first direction DR1.

However, although FIGS. 1A to 1C illustrate an embodiment of the electronic device ED that includes one foldable region FA1, embodiments of the inventive concept are not necessarily limited thereto, and in other embodiments, the electronic device ED includes a plurality of foldable regions. For example, an electronic device according to an embodiment of the inventive concept includes two or more foldable regions, or three or more non-foldable regions with foldable regions interposed between each pair of non-foldable regions.

Referring to FIG. 1B, the electronic device ED according to an embodiment of the inventive concept can be folded with respect to a first folding axis FX1. The first folding axis FX1 is a virtual axis that extends parallel to the second direction axis DR2, and the first folding axis FX1 is parallel to the long side direction of the electronic device ED. The first folding axis FX1 extends in the second direction on the first display surface FS.

The electronic device ED can be folded with respect to the first folding axis FX1 into an in-folded state in which one region of the first display surface FS that overlaps the first non-foldable region NFA1 and the other region that overlaps the second non-foldable region NFA2 face each other.

In the electronic device ED according to an embodiment of the inventive concept, the second display surface RS can be visually recognized by a user in an in-folded state. The second display surface RS further includes an electronic module region in which an electronic module that includes various elements is disposed. However, embodiments of the inventive concept are not necessarily limited thereto.

Referring to FIG. 1C, the electronic device ED according to an embodiment of the inventive concept can be folded with respect to the first folding axis FX1 into an out-folded state in which one region of the second display surface RS that overlaps the first non-foldable region NFA1 and the other region that overlaps the second non-folding region NFA2 face each other.

However, embodiments are not necessarily limited thereto, and in other embodiments, the electronic device ED can be folded with respect to a plurality of folding axes so that portions of the first display surface FS and the second display surface RS can face each other. The number of folding axes and the number of non-foldable regions are not particularly limited.

Various electronic modules can be disposed in the electronic module region EMA. For example, an electronic module may be at least one of a camera, a speaker, a light sensor, or a thermal sensor, etc. The electronic module region EMA can sense an external object through the first or second display surfaces FS and RS or transmit a sound signal such as a voice through the first or second display surfaces FS and RS. In an embodiment, the electronic module includes a plurality of elements, but embodiments are not necessarily limited thereto.

The electronic module region EMA is surrounded by the active region F-AA and the peripheral region F-NAA. However, embodiments of the inventive concept are not necessarily limited thereto, and in other embodiments, the electronic module region EMA is disposed in the active region F-AA.

Figure 2A:
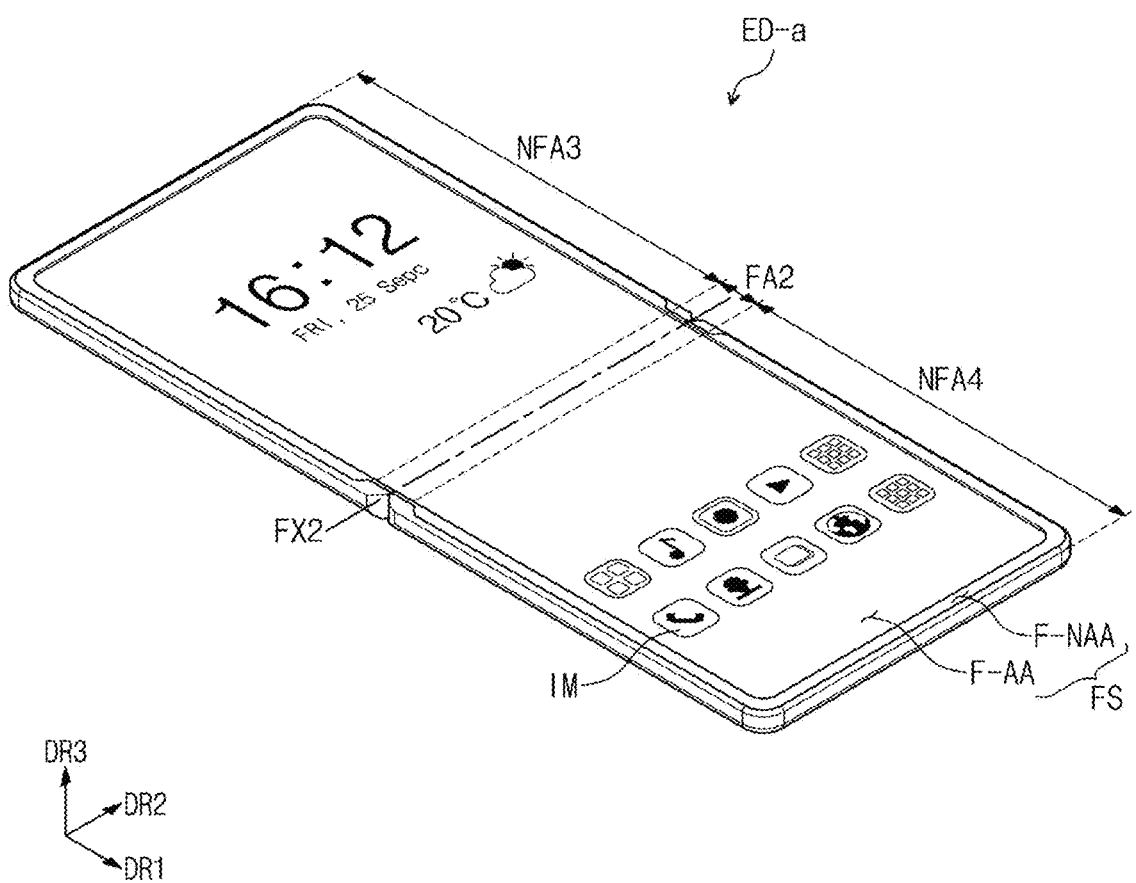
FIG. 2A is a perspective view of an unfolded electronic device according to an embodiment of the inventive concept.
Figure 2B:
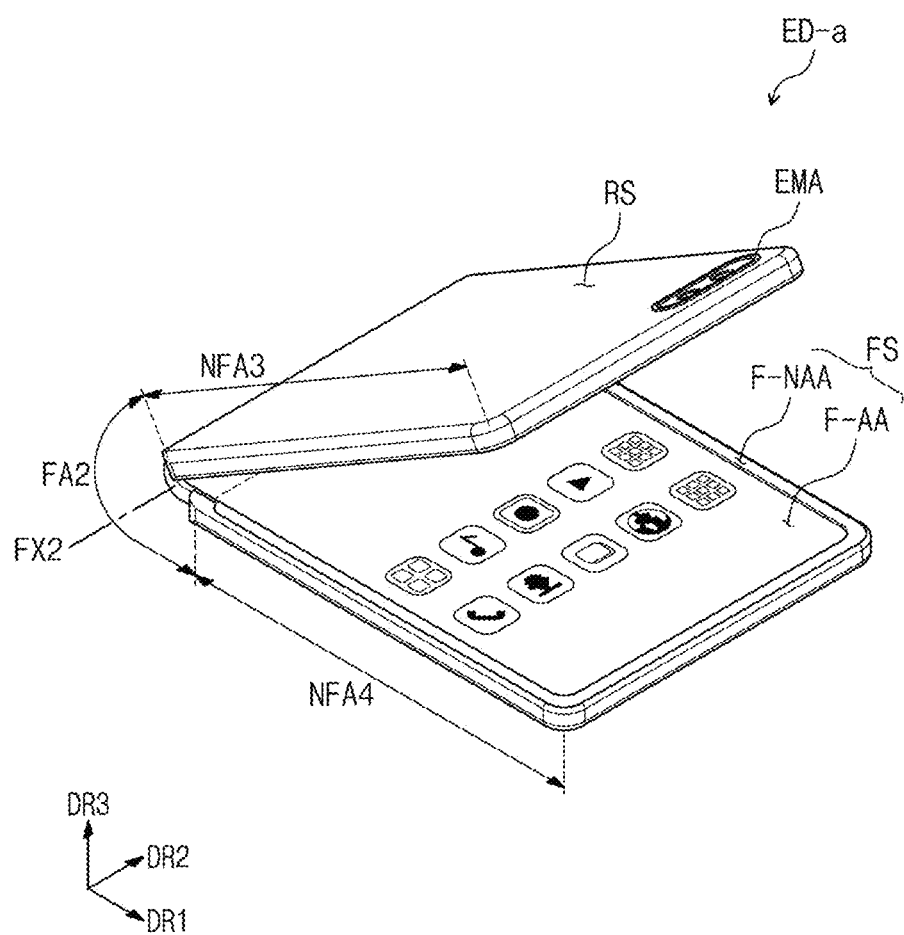
FIG. 2B illustrates an in-folding process of an electronic device according to an embodiment illustrated in FIG. 2A.
Figure 2C:
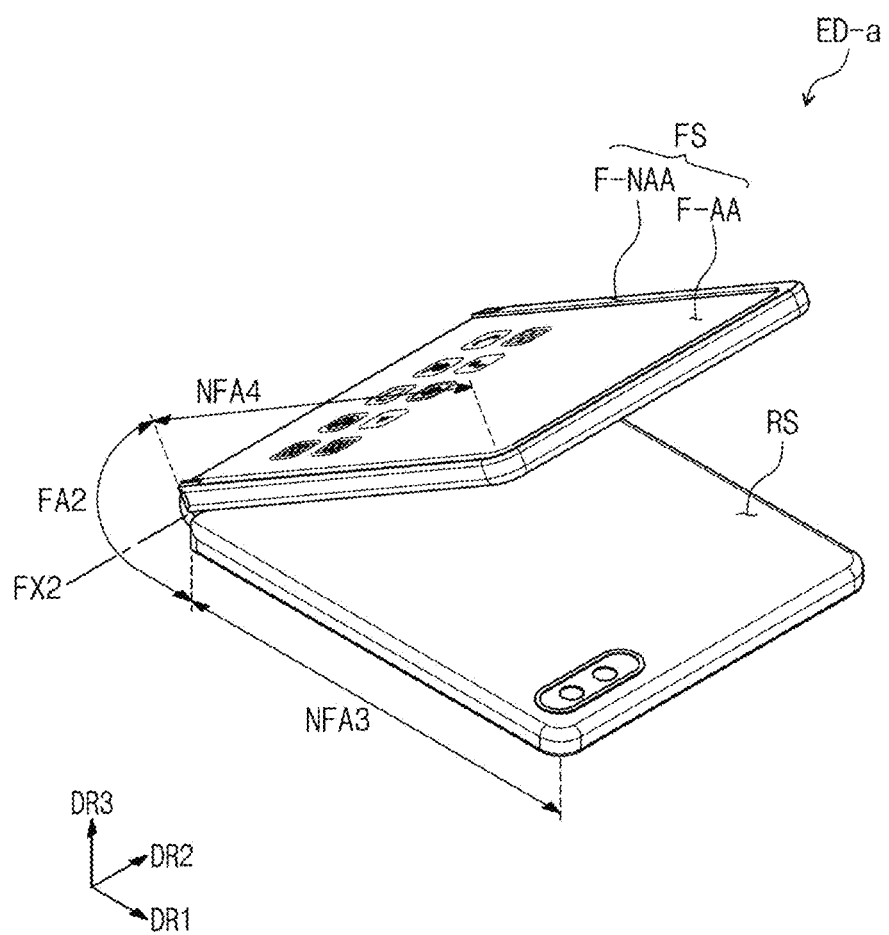
FIG. 2C illustrates an out-folding process of an electronic device according to an embodiment illustrated in FIG. 2A.

FIG. 2A is a perspective view of an unfolded electronic device according to an embodiment of the inventive concept. FIG. 2B illustrates an in-folding process of the electronic device according to the embodiment illustrated in FIG. 2A. FIG. 2C illustrates an out-folding process of the electronic device according to the embodiment illustrated in FIG. 2A.

An electronic device ED-a according to an embodiment of the inventive concept can be folded with respect to a second folding axis FX2 extends in a direction parallel to the second direction axis DR2. FIG. 2B illustrates a case in which the extension direction of the second folding axis FX2 is parallel to the extension direction of the short side of the electronic device ED-a. However, embodiments of the inventive concept are not necessarily limited thereto.

The electronic device ED-a according to an embodiment of the inventive concept includes at least one foldable region FA2 and non-foldable regions NFA3 and NFA4 that are adjacent to the folding region FA2. The non-foldable regions NFA3 and NFA4 are spaced apart from each other in the first direction DR1 with the foldable region FA2 interposed therebetween.

The foldable region FA2 has a predetermined curvature and a predetermined curvature radius. In an embodiment of the inventive concept, referring to FIG. 2B, a third non-foldable region NFA3 and a fourth non-foldable region NFA4 face each other when the electronic device ED-a is in-folded so that a first display surface FS is not externally exposed. In addition, referring to FIG. 2C, in an embodiment of the inventive concept, the electronic device ED-a is out-folded so that the first display surface FS is externally exposed.

The electronic device ED-a according to an embodiment of the inventive concept includes a second display surface RS, and the second display surface RS is opposite to at least a portion of the first display surface FS. The second display surface RS includes an electronic module region EMA in which an electronic module that includes various elements is disposed. In addition, an image or video can be displayed on at least a portion of the second display surface RS.

However, in an embodiment of the inventive concept, the first display surface FS of the electronic device ED-a, can be visually recognized by a user in an unfolded state, and the second display surface RS thereof can be visually recognized by a user in an in-folded state.

In an embodiment of the inventive concept, the electronic devices ED and ED-a are configured to alternately repeat an in-folding operation or an out-folding operation and an unfolding operation, but embodiments of the inventive concept are not necessarily limited thereto. In an embodiment of the inventive concept, the electronic devices ED and ED-a are configured to select one of an unfolding operation, an in-folding operation, and/or an out-folding operation. In addition, when a plurality of foldable regions are included, the folding direction of at least one of the plurality of foldable regions can differ from the folding direction of the remaining foldable regions. For example, when two foldable regions are included, two non-foldable regions with one foldable region interposed therebetween may be in-folded, and two non-foldable regions with the other foldable region interposed therebetween may be out-folded.

Figure 3:
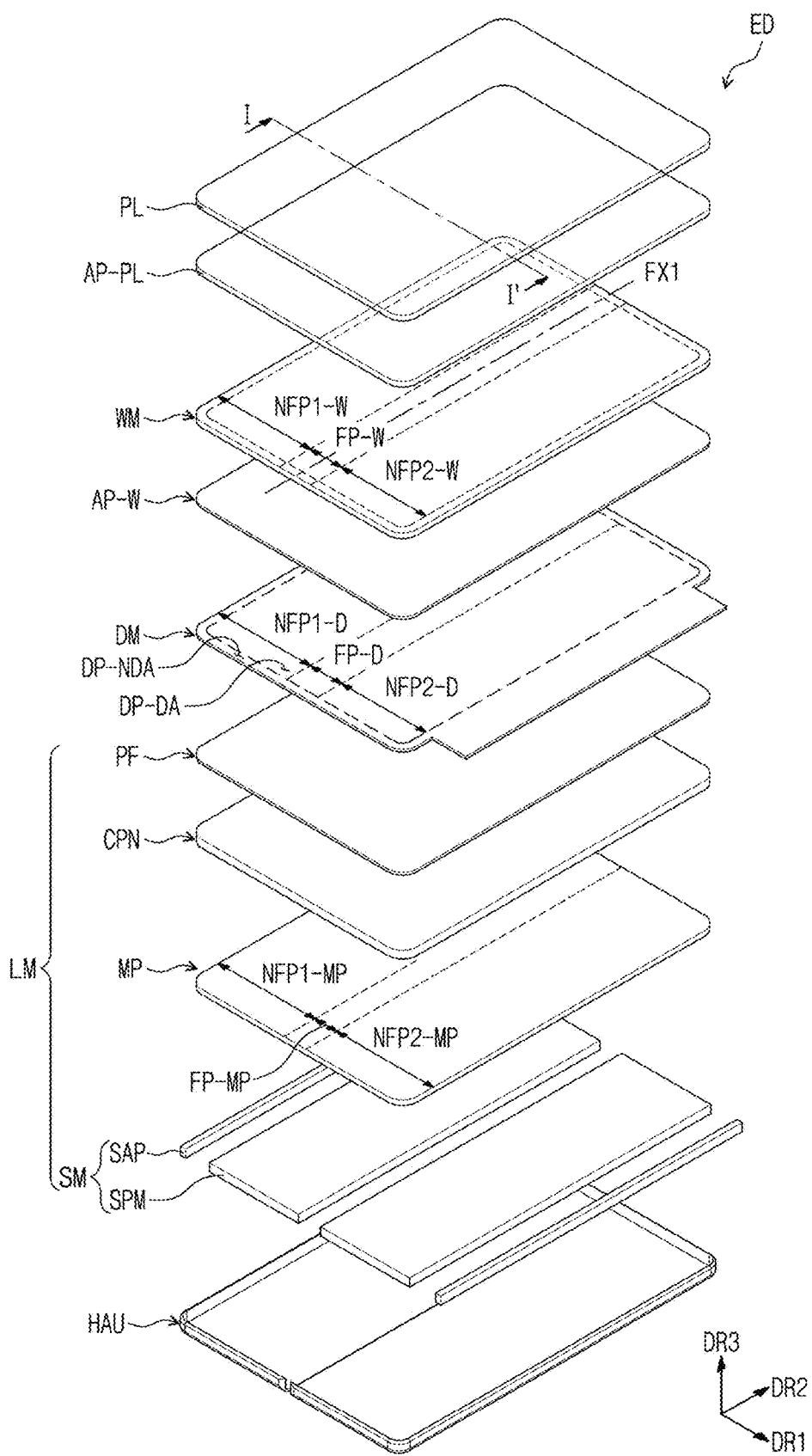
FIG. 3 is an exploded perspective view of an electronic device according to an embodiment of the inventive concept.
Figure 4:
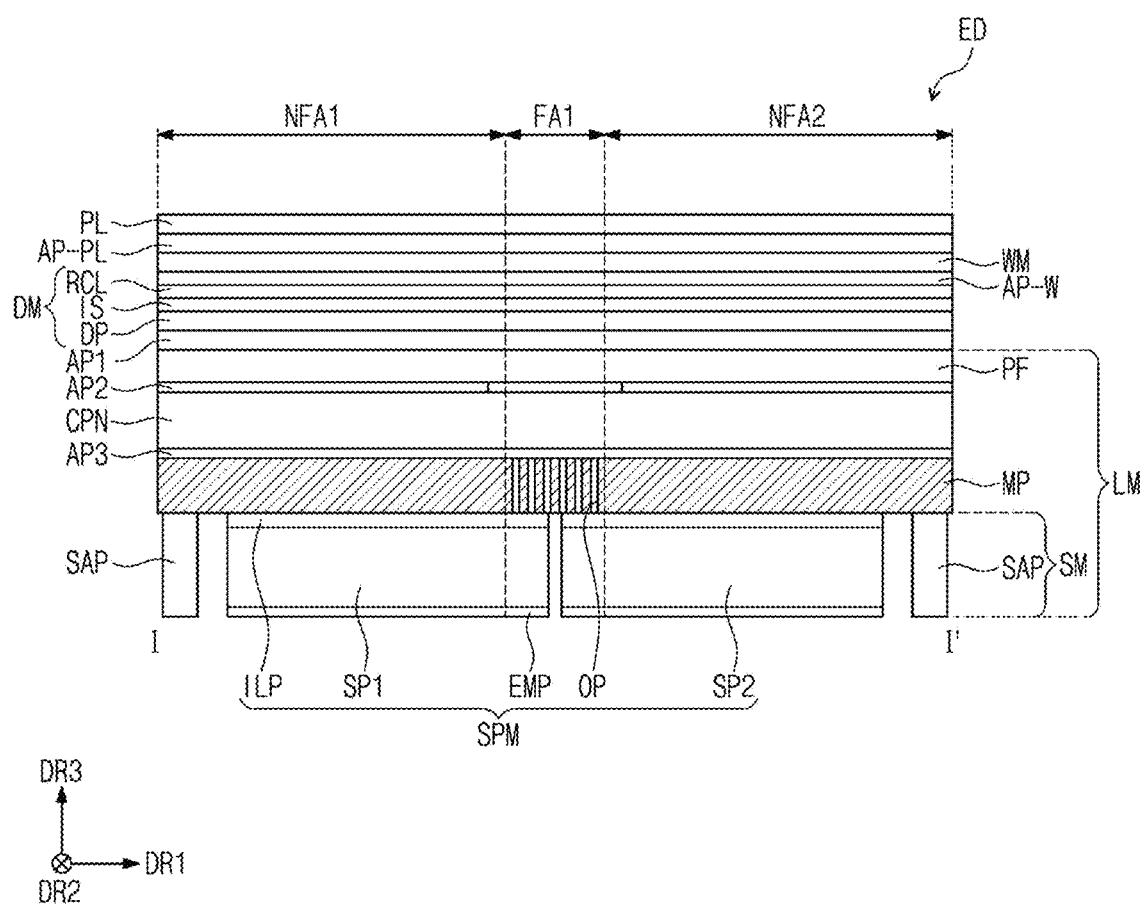
FIG. 4 is a cross-sectional view of an electronic device according to an embodiment of the inventive concept.

FIG. 3 is an exploded perspective view of an electronic device according to an embodiment of the inventive concept, and FIG. 4 is a cross-sectional view of an electronic device according to an embodiment of the inventive concept. FIG. 3 is an exploded perspective view of an electronic device according to an embodiment illustrated in FIG. 1A. FIG. 4 is a cross-sectional view taken along line I-I' of FIG. 3.

FIGS. 3, 4, et seq., illustrate a case in which the first folding axis FX1 of the electronic device ED illustrated in FIGS. 1A to 1C is parallel to the long side of the electronic device ED, but embodiments of the inventive concept are not necessarily limited thereto. Components described below with reference to the drawings may also apply to a case in which the second folding axis FX2 is parallel to the short side of the electronic device as illustrated in FIGS. 2A to 2C.

Referring to FIGS. 3 and 4, the electronic device ED according to an embodiment of the inventive concept includes a display module DM and a window WM disposed above the display module DM. In addition, the electronic device ED according to an embodiment of the inventive concept further includes a lower module LM disposed below the display module DM.

The electronic device ED according to an embodiment of the inventive concept further includes a window adhesive layer AP-W disposed between the display module DM and the window WM and also a protective film PL and a protective adhesive layer AP-PL disposed above the window WM. However, in the electronic device ED according to an embodiment of the inventive concept, the protective film PL and the protective adhesive layer AP-PL may be omitted. When the protective film PL and the protective adhesive layer AP-PL are omitted, the window WM is the uppermost surface of the electronic device ED.

The lower module LM includes a support plate MP disposed below the display module DM. The lower module LM may be referred to as a support member.

The electronic device ED includes a housing HAU in which the display module DM and the lower module LM are accommodated. The housing HAU is coupled to the window WM. In addition, the housing HAU further includes a hinge structure for easy folding or bending. The window WM is a cover window disposed above the display module DM.

The electronic device ED according to an embodiment of the inventive concept includes a window adhesive layer AP-W disposed between the display module DM and the window WM. The window adhesive layer AP-W may be an optically clear adhesive film (OCA) or an optically clear adhesive resin layer (OCR). However, in an embodiment of the inventive concept, the window adhesive layer AP-W may be omitted.

The window WM covers the entire upper surface of the display module DM. The window WM has a shape that corresponds to the shape of the display module DM. The window WM contains glass and is used as a cover window of the electronic device.

The window WM includes a foldable portion FP-W and non-foldable portions NFP1-W and NFP2-W. A first non-foldable portion NFP1-W and a second non-foldable portion NFP2-W of the window WM are spaced apart from each other in the first direction DR1 with the foldable portion FP-W interposed therebetween. The foldable portion FP-W corresponds to the foldable region FA1 (see FIG. 1A), and the non-foldable portions NFP1-W and NFP2-W correspond to the non-foldable regions NFA1 and NFA2 (see FIG. 1A).

In an embodiment of the inventive concept, the window WM has a structure of laminated glass in which a plurality of glass substrates are bonded to each other. Each of the bonded glass substrates is an ultra-thin glass substrate. The window WM according to an embodiment of the inventive concept will be described in more detail below.

The display module DM displays an image using electrical signals and transmits/receives information based on an external input. The display module DM includes a display region DP-DA and a non-display region DP-NDA. The display region DP-DA emits an image provided by the display module DM.

The non-display region DP-NDA is adjacent to the display region DP-DA. For example, the non-display region DP-NDA surrounds the display region DP-DA. However, embodiments are not necessarily limited thereto, and in other embodiments, the non-display region DP-NDA has various other shapes and is not limited to any one embodiment. According to an embodiment of the inventive concept, the display region DP-DA of the display module DM corresponds to at least a portion of the active region F-AA (see FIG. 1A).

In an embodiment of the inventive concept, the display module DM includes a display panel DP. In an embodiment, the display panel DP is a light-emitting display panel, but is not necessarily limited thereto. For example, the display panel DP is one of an organic light-emitting display panel or an inorganic light-emitting display panel. The light-emitting layer of the organic light-emitting display panel contains an organic light-emitting material. The light-emitting layer of the inorganic light-emitting display panel may contain quantum dots, quantum rods, etc.

The display module DM further includes an input sensor IS. The input sensor IS is disposed directly on the display panel DP. The input sensor IS includes a plurality of sensing electrodes. The input sensor IS senses an external input by one of a self-capacitance method or a mutual-capacitance method. The input sensor IS senses an input by an active-type input device.

In an embodiment, the input sensor IS is formed directly on the display panel DP through a continuous process when the display panel DP is produced. However, embodiments of the inventive concept are not necessarily limited thereto, and in some embodiments, the input sensor IS is produced as a panel separate from the display panel DP and then attached to the display panel DP by an adhesive layer.

In addition, the display module DM further includes an optical layer RCL. The optical layer RCL reduces the reflection of external light. In an embodiment, the optical layer RCL includes at least one of a polarization layer or a color filter layer. However, embodiments of the inventive concept are not necessarily limited thereto, and in other embodiments, the optical layer RCL includes optical members that increase the display quality of the electronic device ED.

In an embodiment of the inventive concept, the optical layer RCL is disposed directly on the input sensor IS. In addition, when the input sensor IS is omitted from the display module DM, the optical layer RCL is disposed directly on the display panel DP. However, embodiments of the inventive concept are not necessarily limited thereto, and in some embodiments, the optical layer RCL is disposed on the display panel DP or the input sensor IS by using a separate adhesive member.

The display module DM includes a foldable display portion FP-D and non-foldable display portions NFP1-D and NFP2-D. The foldable display portion FP-D corresponds to the foldable region FA1 (see FIG. 1A), and the non-foldable display portions NFP1-D and NFP2-D correspond to the non-foldable regions NFA1 and NFA2 (see FIG. 1A).

The foldable display portion FP-D can be folded or bent with respect to the first folding axis FX1 (see FIGS. 1B and 1C). The display module DM includes a first non-foldable display portion NFP1-D and a second non-foldable display portion NFP2-D, and the first non-foldable display portion NFP1-D and the second non-foldable display portion NFP2-D are spaced apart from each other in the first direction DR1 with the foldable display portion FP-D interposed therebetween.

In the electronic device ED according to an embodiment of the inventive concept, the lower module LM includes the support plate MP. In addition, in an embodiment of the inventive concept, the lower module LM further includes at least one of a support module SM, a protective layer PF, or a buffer layer CPN. For example, the electronic device ED according to an embodiment of the inventive concept includes a support plate MP disposed below the display module DM, a protective layer PF and a buffer layer CPN disposed between the support plate MP and the display module DM, and a support module SM disposed below the support plate MP.

In an embodiment of the inventive concept, the support plate MP is disposed below the display module DM. The support plate MP includes a foldable support portion FP-MP and non-foldable support portions NFP1-MP and NFP2-MP. A first non-foldable support portion NFP1-MP and a second non-foldable support portion NFP2-MP of the support plate MP are spaced apart from each other in the first direction with the foldable support portion FP-MP interposed therebetween. The foldable support portion FP-MP corresponds to the foldable region FA1 (see FIG. 1A), and the non-foldable support portions NFP1-MP and NFP2-MP correspond to the non-foldable regions NFA1 and NFA2 (see FIG. 1A).

Referring to FIGS. 3 and 4, the protective layer PF is disposed between the display module DM and the support plate MP. The protective layer PF is disposed below the display module DM and protects the rear surface of the display module DM. The protective layer PF overlaps the entire display module DM. The protective layer PF contains a polymer material. For example, the protective layer PF is one of a polyimide film or a polyethylene terephthalate film. However, embodiments are not necessarily limited thereto.

The electronic device ED according to an embodiment of the inventive concept includes a support module SM. The support module SM includes a support portion SPM and a filling portion SAP. The support portion SPM overlaps most of the display module DM. The filling portion SAP is disposed outside the support portion SPM and overlaps an outer portion of the display module DM.

The support module SM includes support layers SP1 and SP2. The support layers SP1 and SP2 include a first sub-support layer SP1 and a second sub-support layer SP2 that are spaced apart from each other in the first direction DR1.

The first sub-support layer SP1 and the second sub-support layer SP2 are spaced apart from each other by a portion that corresponds to the first folding axis FX1 (see FIGS. 1B and 1C). As the support layers SP1 and SP2 are spaced apart from each other by the foldable region FA1, the folding or bending properties of the electronic device ED can be increased. However, the support layers SP1 and SP2 include a cushion layer and a lower support plate that are stacked in the thickness direction thereof.

The lower support plate contains at least one of a metal or a polymer material. For example, the lower support plate is formed of at least one of stainless steel, aluminum, copper, or an alloy thereof.

The cushion layer prevents deformation of the support plate MP due to external impacts and forces. The cushion layer contains at least one of a sponge, foam, or an elastomer such as a urethane resin, etc. In addition, the cushion layer is formed by including at least one of an acrylic-based polymer, a urethane-based polymer, a silicone-based polymer, or an imide-based polymer. However, embodiments of the inventive concept are not necessarily limited thereto. The cushion layer is disposed below the support plate MP or the lower support plate.

In addition, the support module SM further includes at least one of a shielding layer EMP or an interlayer bonding layer ILP. The shielding layer EMP is at least one of an electromagnetic wave shielding layer or a heat dissipation layer. In addition, the shielding layer EMP functions as a bonding layer. The support module SM and the housing HAU are coupled to each other by using the shielding layer EMP.

The support module SM further includes the interlayer bonding layer ILP disposed on the support layers SP1 and SP2. The interlayer bonding layer ILP bonds the support plate MP and the support module SM to each other. The interlayer bonding layer ILP is at least one of a bonding resin layer or an adhesive tape. In an embodiment, a portion of the interlayer bonding layer ILP that overlaps the foldable display portion FP-D is removed. However, embodiments of the inventive concept are not necessarily limited thereto, and in an embodiment, the interlayer bonding layer ILP overlaps the entire foldable display portion FP-D.

The filling portion SAP is disposed outside the supporting layers SP1 and SP2. The filling portion SAP is disposed between the support plate MP and the housing HAU. The filling portion SAP fills a space between the support plate MP and the housing HAU and fixes the support plate MP.

Referring to FIGS. 3 and 4, the electronic device ED according to an embodiment of the inventive concept includes the buffer layer CPN in the lower module LM. The buffer layer CPN may serve as a thickness compensation layer that compensates for thickness variations below the display module DM or as a support layer that supports the display module DM. In some embodiments, the buffer layer CPN is omitted.

In the electronic device ED according to an embodiment of the inventive concept, the combination of components in the lower module LM varies depending on the size and shape of the electronic device ED or the operational characteristics of the electronic device ED.

In addition, the electronic device ED according to an embodiment of the inventive concept further includes at least one of adhesive layers AP1, AP2, or AP3. For example, a first adhesive layer AP1 is disposed between the display module DM and the protective layer PF, a second adhesive layer AP2 is disposed between the protective layer PF and the buffer layer CPN, and a third adhesive layer AP3 is disposed between the support plate MP and the buffer layer CPN. At least one of the adhesive layers AP1, AP2, or AP3 or an optically clear adhesive film (OCA) or an optically clear adhesive resin layer (OCR). However, embodiments of the inventive concept are not necessarily limited thereto, and in some embodiments, at least one of the adhesive layers AP1, AP2, or AP3 has a transmittance of 80% or less.

The electronic device ED according to an embodiment of the inventive concept further include the protective film PL disposed above the window WM. The protective film PL protects the window WM from an external environment. However, in the electronic device ED according to an embodiment of the inventive concept, the protective film PL may be omitted, and the window WM is the uppermost surface of the electronic device ED.

A protective adhesive layer AP-PL is further disposed between the window WM and the protective film PL. The protective adhesive layer AP-PL is an optically clear adhesive layer. When the electronic device ED according to an embodiment of the inventive concept includes the protective film PL, the protective film PL is externally exposed.

The protective film PL has an optical characteristic that has a transmittance of about 90% or more in the visible light region and a haze value of less than about 1%. The protective film PL includes a polymer film. In addition, the protective film PL has the polymer film as a base layer and further includes a functional layer on the base layer, such as a hard coating layer, an anti-fingerprint coating layer, and an antistatic coating layer. In addition, the protective film PL of the electronic device ED according to an embodiment of the inventive concept is flexible.

Figure 5A:
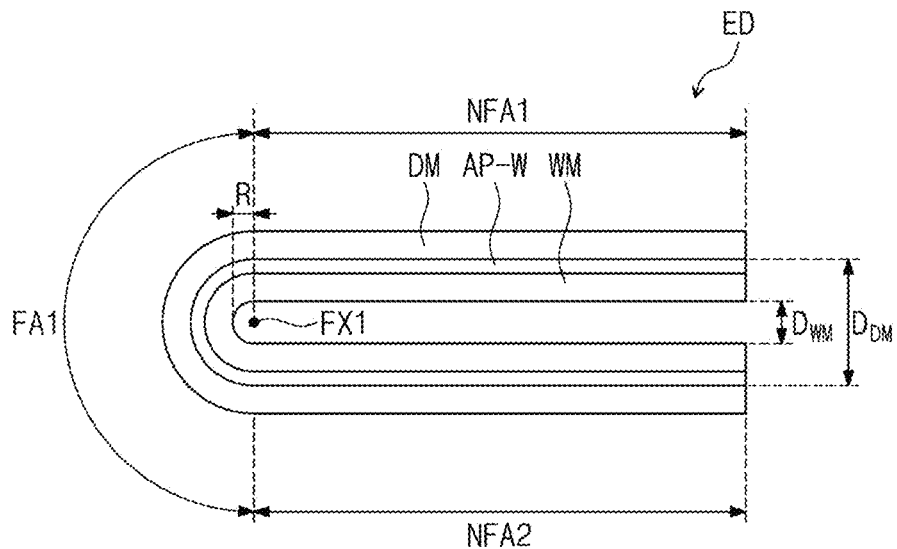
FIG. 5A is a cross-sectional view of a folded electronic device according to an embodiment of the inventive concept.
Figure 5B:
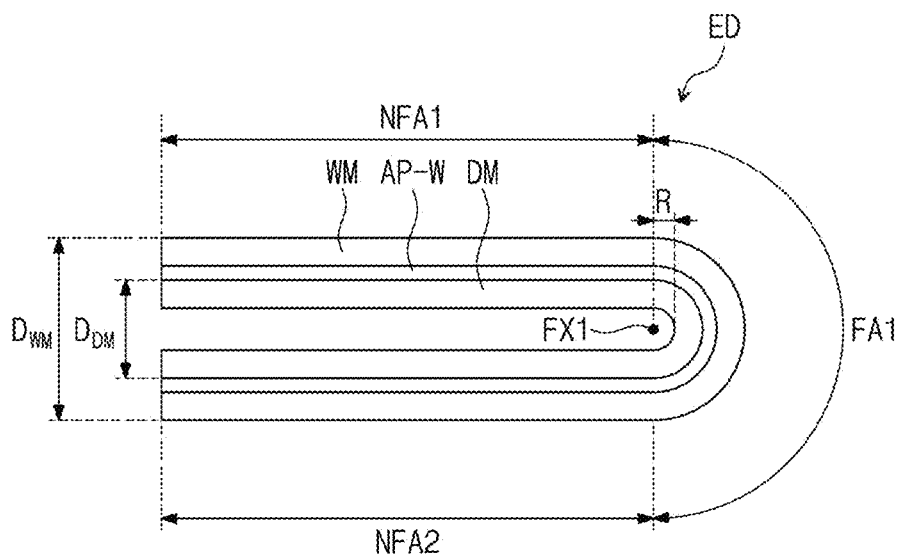
FIG. 5B is a cross-sectional view of a folded electronic device according to an embodiment of the inventive concept.

Each of FIGS. 5A and 5B is a cross-sectional view of a folded electronic device according to an embodiment of the inventive concept. For convenience of illustration, FIGS. 5A and 5B illustrate only the display module DM, the window adhesive layer AP-W, and the window WM of the electronic device ED.

FIG. 5A is a cross-sectional view of an in-folded electronic device ED. In the folded electronic device ED according to an embodiment of the inventive concept, a distance $D_{WM}$ between the upper surfaces of the window WM that face each other is less than a distance $D_{DM}$ between the upper surfaces of the display module DM that face each other. In addition, in the electronic device ED according to an embodiment of the inventive concept, a curvature radius R of the folding region FA1 in-folded with respect to the first folding axis FX1 is about 1 mm or less. For example, the window WM according to an embodiment of the inventive concept to be described below includes a glass substrate that includes a recessed portion defined thereon that corresponds to the foldable region, and the bending limit radius of the curvature radius R of the folding region FA1 can be reduced to about 1 mm or less. However, embodiments of the inventive concept are not necessarily limited thereto, and in other embodiments, the curvature radius R of the foldable region FA1 is greater than about 1 mm.

In addition, the curvature radius R is a function of the thickness of the glass substrate. As the thickness of the glass substrate decreases, the curvature radius R decreases. For example, when the thickness of the glass substrate is reduced by about 10%, the curvature radius when folding the glass substrate is also be reduced by about 10%. When the thickness of the glass substrate is about 30 μm, the curvature radius is about 1 mm, and when the thickness of the glass substrate is reduced to about 20 μm, the curvature radius is reduced to about 0.67 mm. However, the curvature radius R can be reduced only to a range that satisfies a minimum bending fracture strength value in which the glass substrate does not break during bending.

FIG. 5B is a cross-sectional view of an out-folded state electronic device ED. In the folded electronic device ED according to an embodiment of the inventive concept, a distance $D_{DM}$ between the upper surfaces of the display module DM that face each other is less than a distance $D_{WM}$ between the upper surfaces of the window WM that face each other. In addition, in the electronic device ED according to an embodiment of the inventive concept, the curvature radius R of the foldable region FA1 that is out-folded with respect to the first folding axis FX1 is about 1 mm or less. For example, the window WM according to an embodiment of the inventive concept to be described below includes a glass substrate that includes a recessed portion defined thereon that corresponds to the foldable region, and the bending limit radius as the curvature radius of the folding region FA1 can be reduced to about 1 mm or less. However, embodiments of the inventive concept are not necessarily limited thereto, and in some embodiments, the curvature radius R of the folding region FA1 is greater than about 1 mm.

Figure 6A:
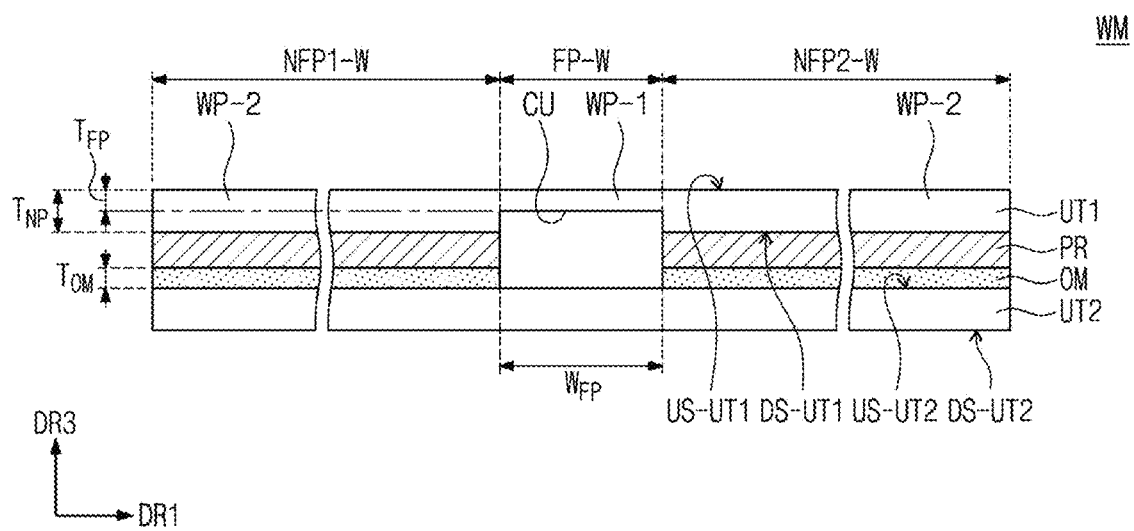
FIG. 6A is a cross-sectional view of a window according to an embodiment of the inventive concept.
Figure 6B:
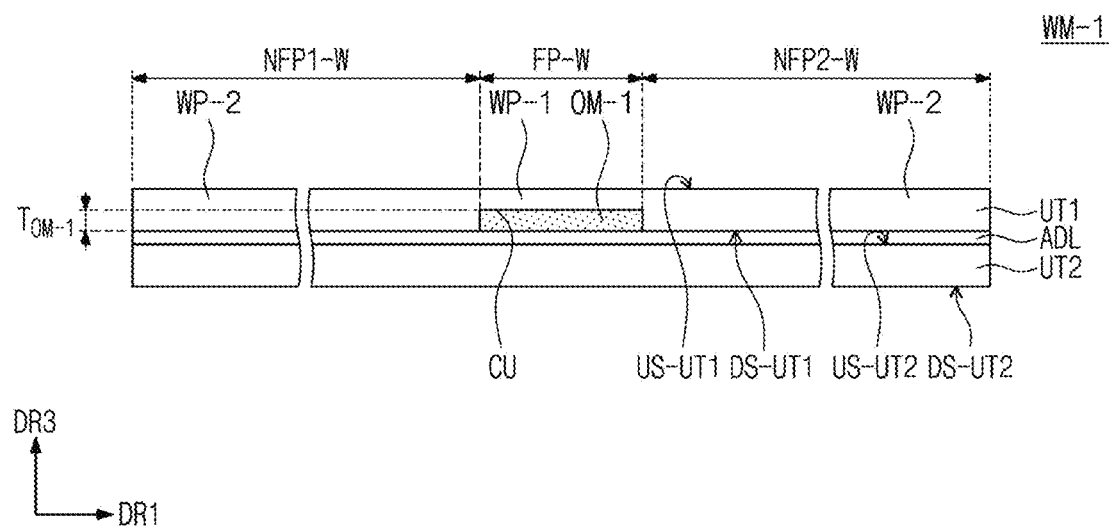
FIG. 6B is a cross-sectional view of a window according to an embodiment of the inventive concept.

FIG. 6A is a cross-sectional view of a window according to an embodiment of the inventive concept. FIG. 6B is a cross-sectional view of a window according to an embodiment of the inventive concept.

Referring to FIGS. 6A and 6B, windows WM and WM-1 according to an embodiment of the inventive concept include a plurality of glass substrates UT1 and UT2 and an adhesive layer disposed between the glass substrates UT1 and UT2. For example, the window WM according to an embodiment of the inventive concept has a structure of laminated glass that includes a plurality of stacked glass substrates UT1 and UT2.

The windows WM and WM-1 according to an embodiment of the inventive concept include a first non-foldable portion NFP1-W, a second non-foldable portion NFP2-W, and a foldable portion FP-W disposed between the first non-foldable portion NFP1-W and the second non-foldable portion NFP2-W.

Referring to FIG. 6A, the window WM according to an embodiment of the inventive concept includes a first glass substrate UT1, a second glass substrate UT2, a protection layer OM disposed between the first glass substrate UT1 and the second glass substrate UT2, and a photoresist layer PR disposed between the first glass substrate UT1 and the protective layer OM. In the window WM according to an embodiment of the inventive concept, at least one of the first glass substrate UT1 or the second glass substrate UT2 has a recessed portion CU formed on one surface thereof adjacent to the protective layer OM. The recessed portion CU corresponds to the foldable portion FP-W. For example, the window WM according to an embodiment of the inventive concept has a recessed portion defined on one of the two bonded glass substrates UT1 and UT2, or recessed portions defined on each of the two glass substrates UT1 and UT2. In addition, although that the figures show one recessed portion formed on one glass substrate, embodiments of the inventive concept are not necessarily limited thereto. For example, when the electronic device includes a plurality of foldable regions, a plurality of recessed portions are formed on at least one glass substrate.

Each of the first glass substrate UT1 and the second glass substrate UT2 is a tempered glass substrate. Each of the first glass substrate UT1 and the second glass substrate UT2 has been chemically tempered or thermally tempered. The tempered first glass substrate UT1 and the tempered second glass substrate UT2 exhibit different compressive stress characteristics. However, embodiments of the inventive concept are not necessarily limited thereto, and in some embodiments, the tempered first glass substrate UT1 and the tempered second glass substrate UT2 exhibit similar compressive stress characteristics.

In the window WM according to an embodiment of the inventive concept, the second glass substrate UT2, the protective layer OM, and the first glass substrate UT1 are sequentially stacked in the third direction DR3. In the electronic device ED (see FIG. 3) according to an embodiment of the inventive concept, the second glass substrate UT2 in the window WM is adjacent to the display module DM. However, embodiments of the inventive concept are not necessarily limited thereto.

The first glass substrate UT1 includes an upper surface US-UT1 and a lower surface DS-UT1 that face each other in the thickness direction or third direction DR3, and the second glass substrate UT2 includes an upper surface US-UT2 and a lower surface DS-UT2 that face each other in the thickness direction or third direction DR3. Each of the lower surface DS-UT1 of the first glass substrate UT1 and the upper surface US-UT2 of the second glass substrate UT2 is adjacent to the protective layer OM.

In an embodiment of the inventive concept, the recessed portion CU is formed on the lower surface DS-UT1 of the first glass substrate UT1. The recessed portion CU is concavely recessed from the lower surface DS-UT1 of the first glass substrate UT1 toward the direction of the upper surface US-UT1. For example, the recessed portion CU is concavely recessed in the thickness or third direction DR3. The recessed portion CU corresponds to the foldable portion FP-W. FIG. 6A shows the recessed portion CU as having an angular shape in which a corner portion at which two sides intersect each other is a right angle, but embodiments of the inventive concept are not necessarily limited thereto. In some embodiments, the shape of the recessed portion CU includes a curved portion, or the corner portion at which two sides intersect each other has an acute angle or an obtuse angle.

The recessed portion CU is formed on the lower surface DS-UT1 of the first glass substrate UT1 through a slimming process. In a slimming process, at least one of a physical polishing method or a chemical polishing method, etc., is used. In addition, in an embodiment of the inventive concept, the recessed portion CU is formed by slimming one surface of the glass substrate using laser light.

In an embodiment of the inventive concept, the thickness of the first glass substrate UT1 at a portion at which the recessed portion CU is formed is less than that of the remaining portion. For example, in an embodiment of the inventive concept, in the first glass substrate UT1, the thickness $T_{FP}$ of the portion that corresponds to the foldable portion FP-W is less than the thickness $T_{NP}$ of the portion that corresponds to the non-foldable portions NFP1-W and NFP2-W. Since the window WM according to an embodiment of the inventive concept includes a glass substrate in which the thickness of the portion that corresponds to the foldable portion FP-W is less than the thickness of the portion that corresponds to the non-foldable portions NFP1-W and NFP2-W, the window WM exhibits good folding properties.

The first glass substrate UT1 includes a first portion WP-1 that corresponds to the foldable portion FP-W and a second portion WP-2 that corresponds to the non-foldable portions NFP1-W and NFP2-W. The thickness $T_{FP}$ of the first portion WP-1 is less than the thickness $T_{NP}$ of the second portion WP-2. The thickness $T_{FP}$ of the first portion WP-1 is about 20 μm to about 100 μm, and the thickness $T_{NP}$ of the second portion WP-2 is about 50 μm to about 300 μm. For example, in an embodiment of the inventive concept, the thickness $T_{FP}$ of the first portion WP-1 is about 20 μm to about 30 μm, and the thickness $T_{NP}$ of the second portion WP-2 is about 50 μm to about 100 μm. Since the thickness of the first portion WP-1 is less than the thickness of the second portion WP-2, the window WM according to an embodiment of the inventive concept exhibits good folding properties and excellent impact resistance.

A width $W_{FP}$ of the foldable portion FP-W is about 20 mm or less. The width $W_{FP}$ of the foldable portion FP-W is a distance between the first non-foldable portion NFP1-W and the second non-foldable portion NFP2-W. Since the foldable portion FP-W has a width of about 20 mm or less, the electronic device ED (see FIG. 3) that includes the window WM exhibits good folding properties.

In an embodiment, the upper surface US-UT2 of the second glass substrate UT2 is flat. However, embodiments of the inventive concept are not necessarily limited thereto. In an embodiment of the inventive concept, the second glass substrate UT2 further includes a recessed portion that corresponds to the foldable portion FP-W and that is concavely recessed in the thickness or third direction DR3 from the upper surface US-UT2 toward the lower surface DS-UT2.

In addition, in an embodiment, in the window WM according to an embodiment of the inventive concept, an empty space is formed in a portion that corresponds to the foldable portion FP-W and where the recess CU is formed. For example, the empty space is formed between the first portion WP-1 and the second glass substrate UT2. However, embodiments of the inventive concept are not necessarily limited thereto, and in some embodiments, the window WM further includes an organic material or an inorganic material that fills the space between the first portion WP-1 and the second glass substrate UT2 where the recess CU is formed.

The protection layer OM corresponds to the non-foldable portions NFP1-W and NFP2-W of the window WM. The protection layer OM is disposed between the second portion WP-2 of the first glass substrate and the second glass substrate UT2. The protection layer OM contains a high-hardness material. For example, the protection layer OM contains an inorganic oxide. For example, the protection layer OM contains an aluminum oxide ($Al_2O_3$). The window WM according to an embodiment of the inventive concept has excellent impact resistance by including the protection layer OM that contains a high-hardness material disposed between the second portion WP-2 and the second glass substrate UT2.

The thickness $T_{OM}$ of the protection layer OM is about 10,000 μm or less. When the thickness $T_{OM}$ of the protection layer OM exceeds about 10,000 μm, the tensile stress applied to the first glass substrate UT1 and the second glass substrate UT2 increases as the compressive stress of the protection layer OM increases. For example, when the thickness $T_{OM}$ of the protection layer OM exceeds about 10,000 μm, the increase in impact resistance of the protection layer OM is less than when the thickness $T_{OM}$ of the protection layer OM is about 10000 μm or less.

The protection layer OM is optically transparent. The light transmittance of the protection layer OM is similar to that of the first glass substrate UT1 or the second glass substrate UT2. For example, the ratio of the transmittance of the protection layer OM to the transmittance of the first glass substrate UT1 is from about 100:99 to about 100:101. Accordingly, the electronic device ED (see FIG. 1A) that includes the window WM according to an embodiment of the inventive concept has good visibility.

The photoresist layer PR is disposed between the first glass substrate UT1 and the protection layer OM. The photoresist layer PR is disposed between the second portion WP-2 and the protection layer OM. The photoresist layer PR contains a photoresist that is used in a photolithography process. The photoresist layer PR is a portion that is not removed after the protective layer OM is patterned through a photolithography process.

The photoresist layer PR contains an adhesive component. The photoresist layer PR bonds the first glass substrate UT1 and the second glass substrate UT2 to each other. In an embodiment of the inventive concept, since the photoresist layer PR bonds the first glass substrate UT1 and the second glass substrate UT2 to each other, the first glass substrate UT1 and the second glass substrate UT2 can be bonded to each other without an additional adhesive layer.

The window WM-1 illustrated in FIG. 6B differs from the window WM illustrated in FIG. 6A in that the window WM-1 does not include the photoresist layer PR and also in that a protection layer OM-1 is disposed in the recess CU between the first portion WP-1 of the first glass substrate UT1 and the second glass substrate UT2. In addition, the window WM-1 according to an embodiment of the inventive concept further includes an adhesive layer ADL disposed between the first glass substrate UT1 and the second glass substrate UT2.

Referring to FIG. 6B, in the window WM-1 according to an embodiment of the inventive concept, the protection layer OM-1 is disposed between the first portion WP1 of the first glass substrate UT1 and the second glass substrate UT2. The protection layer OM-1 is disposed on a portion that corresponds to the foldable portion WP-1. The protection layer OM-1 fills the recessed portion CU formed on the first glass substrate UT1.

The protection layer OM-1 contains a high-hardness material. For example, the protection layer OM-1 contains an inorganic oxide. For example, the protection layer OM-1 contains an aluminum oxide ($Al_2O_3$). Since the window WM-1 according to an embodiment of the inventive concept includes the protection layer OM-1 that contains a high-hardness material disposed between the first portion WP-1 and the second glass substrate UT2, the window WM-1 has excellent impact resistance.

The thickness $T_{OM-1}$ of the protection layer OM-1 is about 100 μm or less. When the thickness $T_{OM-1}$ of the protection layer OM-1 exceeds about 100 μm, a tensile stress applied to the first glass substrate UT1 and the second glass substrate UT2 increases as a compressive stress of the protection layer OM-1 increases. For example, when the thickness $T_{OM-1}$ of the protection layer OM-1 exceeds about 100 μm, the increase in impact resistance of the protection layer OM-1 is less than when the thickness $T_{OM-1}$ of the protection layer OM-1 is about 100 μm or less.

The protection layer OM-1 is optically transparent. The light transmittance of the protection layer OM-1 is similar to that of the first glass substrate UT1 or the second glass substrate UT2. For example, the ratio of the light transmittance of the protection layer OM-1 to the light transmittance of the first glass substrate UT1 is from about 100:99 to about 100:101. Accordingly, the electronic device ED (see FIG. 1A) that includes the window WM-1 according to an embodiment of the inventive concept has good visibility.

Figure 7:
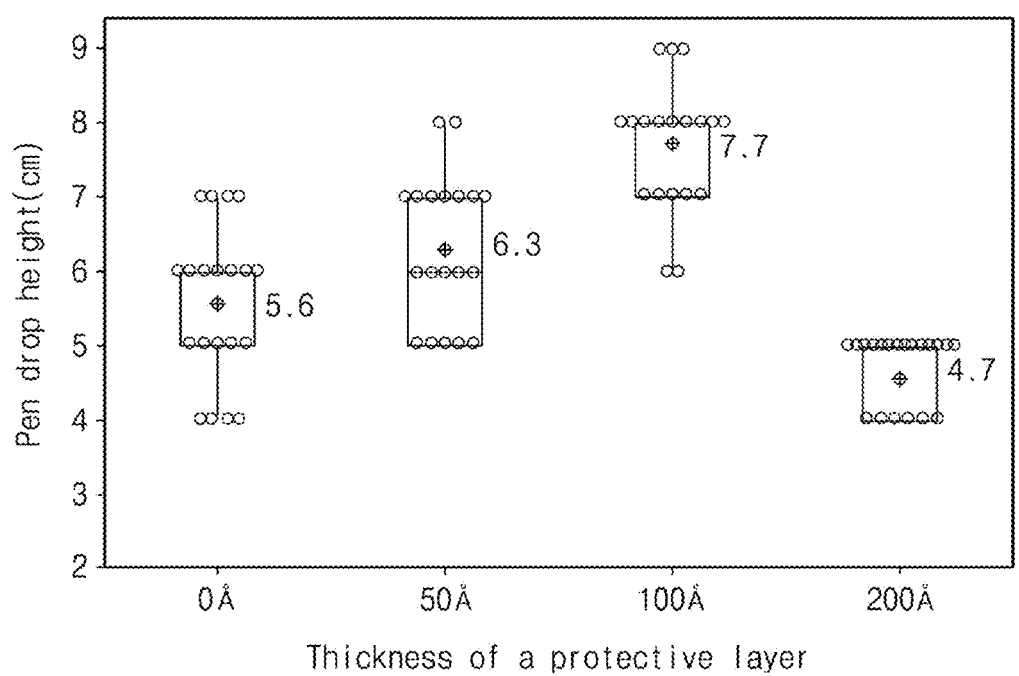
FIG. 7 is a graph of changes in pen drop height as a function of changes in the thickness of a protective layer in a window according to an embodiment of the inventive concept.

FIG. 7 illustrates a result of evaluating the impact resistance of the electronic device according to an embodiment of the inventive concept. FIG. 7 is a graph of pen drop heights as a function of the thicknesses of the protective layer.

Impact resistance was evaluated by a pen drop test method. Impact resistance was evaluated by dropping a pen of a certain weight on the upper surface of the window from a predetermined height and observing the cracks, etc., of the window with the naked eye. FIG. 7 shows the average values of the minimum heights at which the cracks, etc., of the window occur in the impact resistance test. The pen used in the pen drop test had a ball size of about 0.7 φ and a weight of about 5.35 g.

In FIG. 7, the results of the pen drop test were evaluated by dropping the pen when a module simulation structure was disposed above a surface plate. The module simulation structure includes a glass substrate and an $Al_2O_3$-containing protective layer disposed on the glass substrate. For example, tests were carried out when the thicknesses of the protective layer are 0 (i.e., no protective layer), 50 Å, 100 Å, and 200 Å.

Referring to FIG. 7, it can be seen that a glass substrate that has a protection layer that has a thickness of about 50 Å or 100 Å has a greater pen drop height than a glass substrate without a protection layer. In addition, for a glass substrate that has a protection layer that has a thickness of about 200 Å, the pen drop height thereof is lower than that of a glass substrate without a protection layer. Thus, an $Al_2O_3$-containing protection layer protects the glass substrate when the thickness is about 100 Å or less. In addition, a window that includes an $Al_2O_3$-containing protection layer that has a thickness of about 100 Å or less has increased impact resistance.

Hereinafter, a method of manufacturing an electronic device according to an embodiment of the inventive concept will be described with reference to FIGS. 8A to 18. The structure of the electronic device and the components thereof that have been described with reference to FIGS. 1 to 7 will not be described here, and the manufacturing method will be mainly described.

Figure 8A:
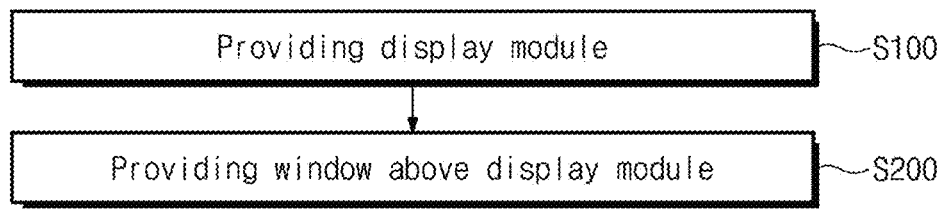
FIG. 8A is a flowchart of a method of manufacturing the electronic device according to an embodiment of the inventive concept.
Figure 8B:
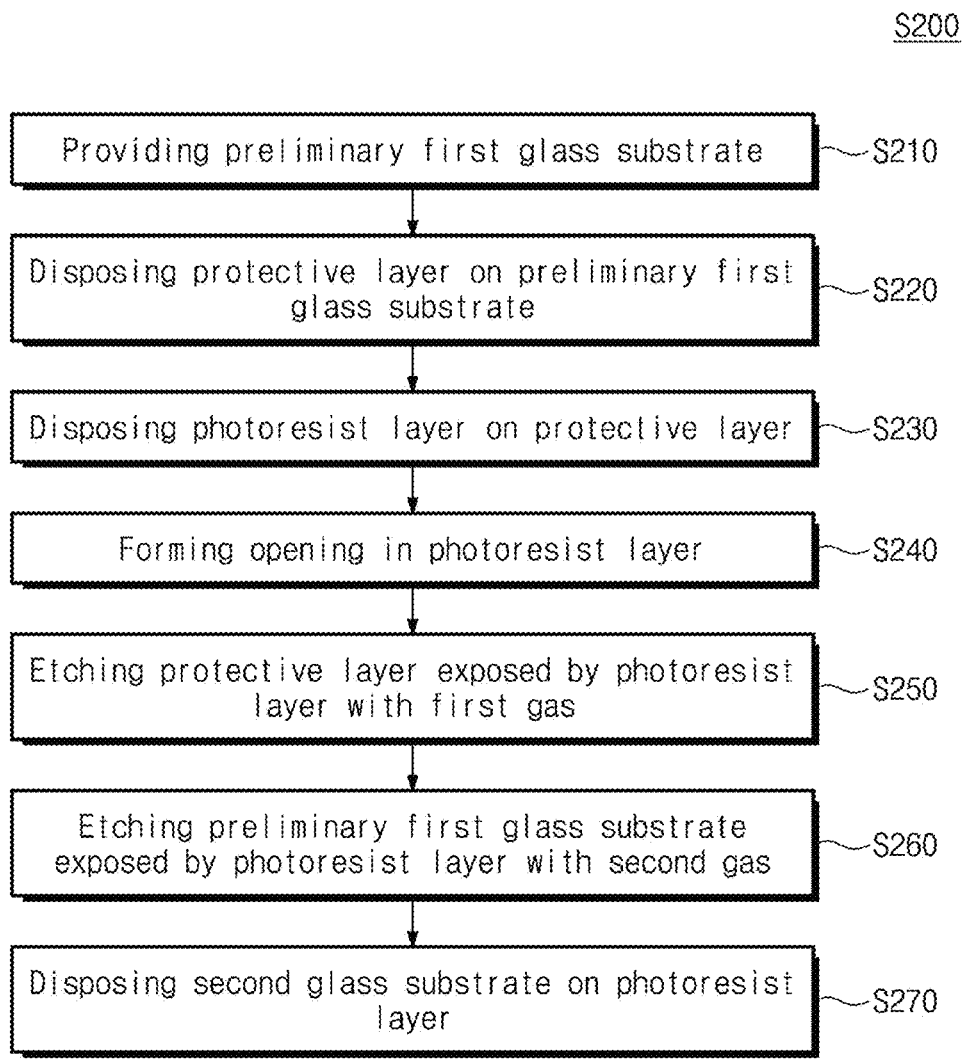
FIG. 8B is a flowchart of a method of manufacturing an electronic device according to an embodiment of the inventive concept.
Figure 8C:
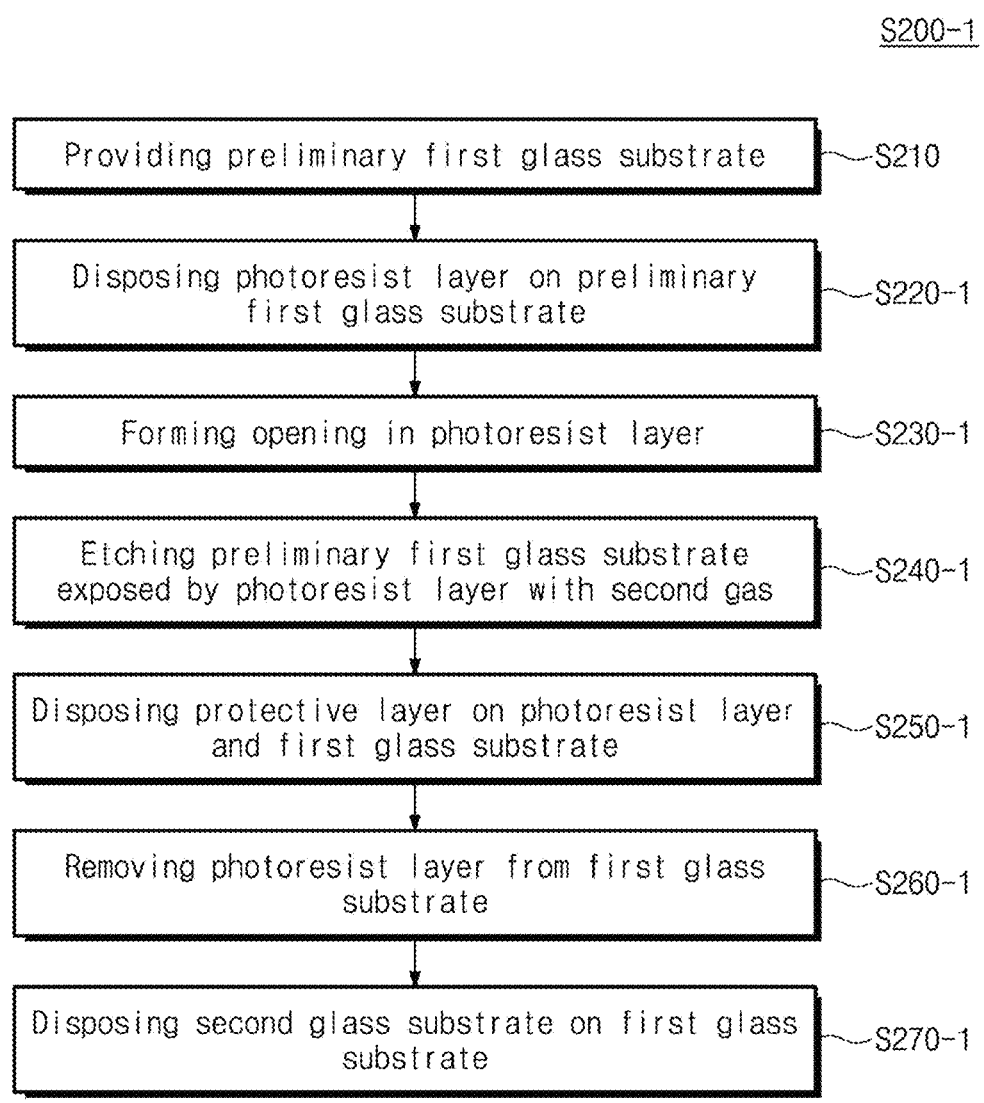
FIG. 8C is a flowchart of a method of manufacturing an electronic device according to an embodiment of the inventive concept.

FIG. 8A is a flowchart of a method of manufacturing an electronic device according to an embodiment of the inventive concept. FIG. 8B is a flowchart of a step of a method of manufacturing an electronic device according to an embodiment of the inventive concept. FIG. 8C is a flowchart of a step of a method of manufacturing an electronic device according to an embodiment of the inventive concept. Each of FIGS. 9 to 18 illustrates a step of a method of manufacturing an electronic device.

Referring to FIGS. 8A and 8B, a method of manufacturing an electronic device according to an embodiment of the inventive concept includes providing a display module (S100) and providing a window on the display module (S200). In an embodiment, the step of providing the window (S200) is illustrated in FIG. 8B and includes providing a preliminary first glass substrate (S210), disposing a protection layer on the preliminary first glass substrate (S220), disposing a photoresist layer on the protection layer (S230), forming an opening in the photoresist layer (S240), etching the protection layer exposed by the photoresist layer with a first gas (S250), etching the preliminary first glass substrate exposed by the photoresist layer with a second gas (S260), and disposing a second glass substrate on the photoresist layer (S270).

In an embodiment, referring to FIG. 8C, the step of providing the window (S200-1) includes providing a preliminary first glass substrate (S210-1), disposing a photoresist layer on the preliminary first glass substrate (S220-1), forming an opening in the photoresist layer (S230-1), etching the preliminary first glass substrate exposed by the photoresist layer with a second gas (S240-1), disposing a protection layer on the photoresist layer and the first glass substrate (S250-1), removing the photoresist layer from the first glass substrate (S260-1), and disposing a second glass substrate on the first glass substrate (S270-1).

Hereinafter, a method of manufacturing an electronic device according to an embodiment of the inventive concept illustrated in FIGS. 8A and 8B will be described with reference to FIGS. 9 to 13, and a method of manufacturing an electronic device according to an embodiment of the inventive concept illustrated in FIGS. 8A and 8C will be described with reference to FIGS. 14A to 18.

Figure 9:
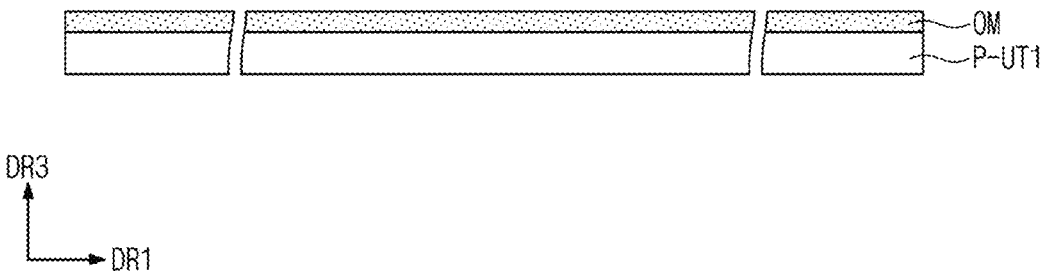
FIG. 9 is a cross-sectional view that illustrates a step of a method of manufacturing an electronic device according to an embodiment of the inventive concept.

In a method of manufacturing an electronic device according to an embodiment of the inventive concept, FIG. 9 illustrates disposing a protection layer OM on a preliminary first glass substrate P_UT1 (S220). Referring to FIG. 9, the preliminary first glass substrate P-UT1 includes a flat surface. In step S220, the protection layer OM is disposed on one flat surface of the preliminary first glass substrate P-UT1. The protection layer OM is formed by a sputtering method.

Figure 10A:
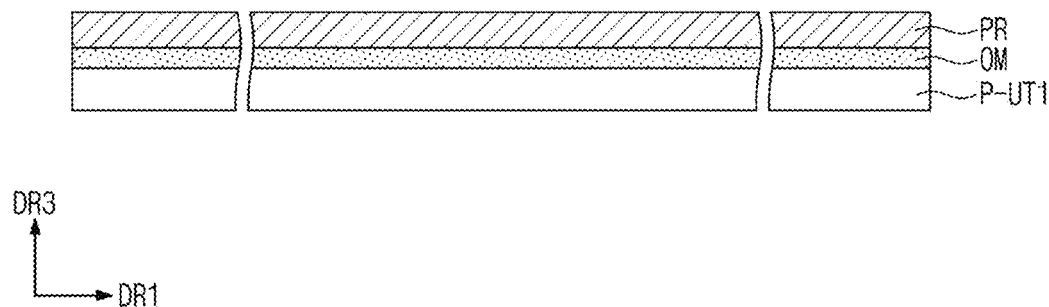
FIG. 10A is a cross-sectional view that illustrates a step of a method of manufacturing an electronic device according to an embodiment of the inventive concept.
Figure 10B:
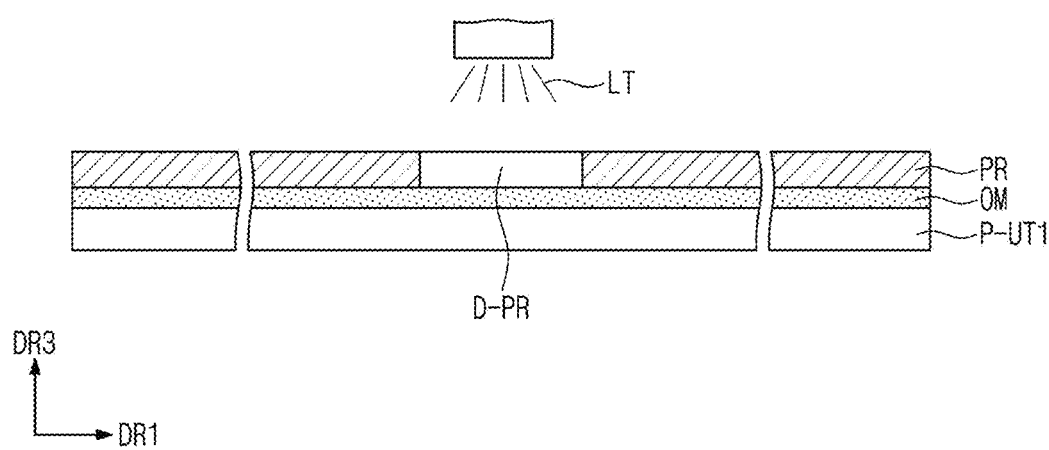
FIG. 10B is a cross-sectional view that illustrates a step of a method of manufacturing an electronic device according to an embodiment of the inventive concept.

FIG. 10A illustrates disposing a photoresist layer on a protective layer (S230). FIG. 10B illustrates forming an opening in a photoresist layer PR (S240). In the step S230 of disposing the photoresist layer PR on the protection layer OM, the photoresist layer PR is disposed on the entire surface of the protection layer OM. The step S240 of forming the opening on the photoresist layer PR includes irradiating light LT on the photoresist layer. The step S240 of forming the opening on the photoresist layer PR further includes removing a photoresist layer D-PR that was irradiated with light LT.

Figure 11:
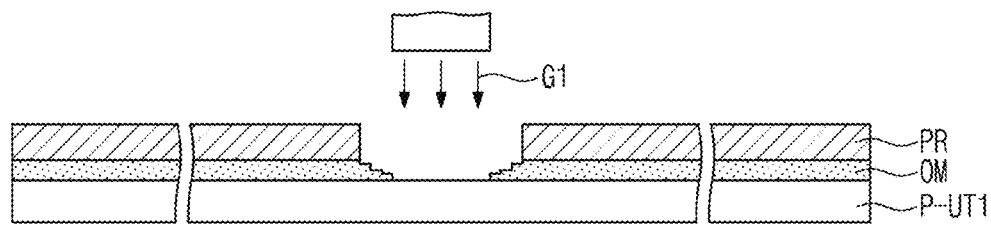
FIG. 11 is a cross-sectional view that illustrates a step of a method of manufacturing an electronic device according to an embodiment of the inventive concept.

FIG. 11 illustrates etching a protection OM layer exposed by a photoresist layer with a first gas (S250). The step S250 of etching the protection layer OM exposed by the photoresist layer PR with the first gas G1 (S250) includes removing a portion of the protection layer OM that corresponds to the foldable portion FP-W (see FIG. 6A). For example, the protection layer OM exposed by the photoresist layer PR is etched with the first gas (S250) in a photolithography process. Since a method of manufacturing an electronic device according to an embodiment of the inventive concept includes a photolithography process, the protection layer OM is precisely processed. The first gas G1 includes a chlorine-based gas. For example, the first gas G1 includes at least one of $Cl_2$, HCl, HBr, or $BCl_3$.

Figure 12:
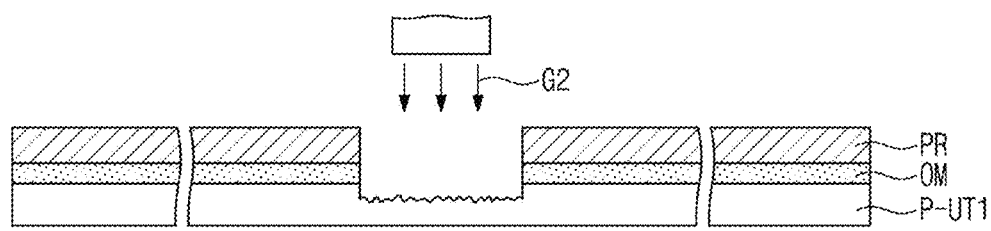
FIG. 12 is a cross-sectional view that illustrates a step of a method of manufacturing an electronic device according to an embodiment of the inventive concept.

FIG. 12 illustrates etching a preliminary first glass substrate P_UT1 exposed by a photoresist layer PR with a second gas (S260). The step S260 of etching the preliminary first glass substrate P-UT1 exposed by the photoresist layer PR with the second gas G2 (S260) includes removing a portion of the preliminary first glass substrate P-UT1 that corresponds to the foldable portion FP-W (see FIG. 6A). For example, the preliminary first glass substrate P-UT1 exposed by the photoresist layer PR is etched with the second gas G2 (S260) in a photolithography process. Since a method of manufacturing an electronic device according to an embodiment of the inventive concept includes a photolithography process, the glass substrate P_UT1 is precisely processed. The second gas G2 includes a fluorine-based gas. For example, the second gas G2 includes at least one of $SF_6$, $SF_4$, $CHF_3$, $C_2F_6$, $C_3F_6$, or $C_4F_8$.

Figure 13:
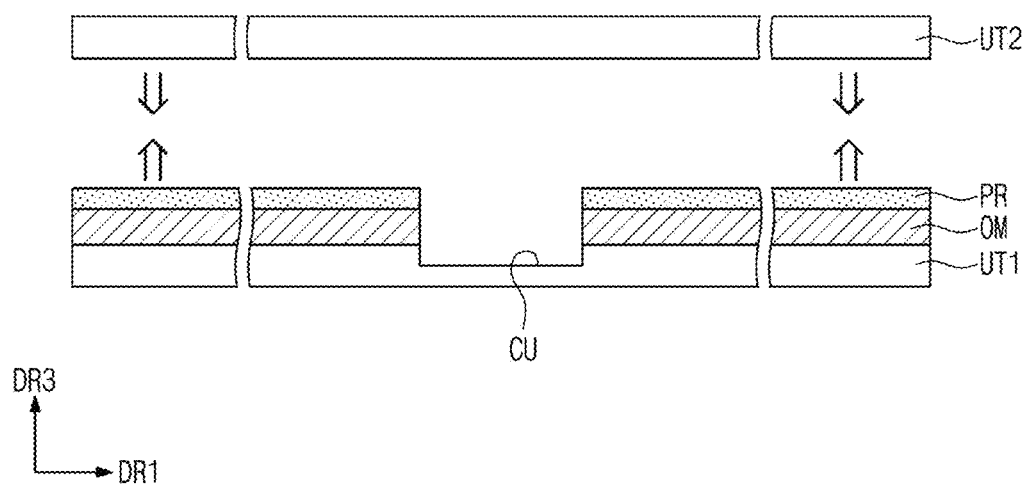
FIG. 13 is a cross-sectional view that illustrates a step of a method of manufacturing an electronic device according to an embodiment of the inventive concept.

FIG. 13 illustrates bonding a first glass substrate UT1 and a second glass substrate UT2 to each other (S270). Referring to FIG. 13, the step S270 of bonding the first glass substrate UT1 and the second glass substrate UT2 to each other (S270) includes a step in which the photoresist layer PR bonds the first glass substrate UT1 and the second glass substrate UT2 to each other. Accordingly, since the first glass substrate UT1 and the second glass substrate UT2 are bonded to each other without a separate adhesive layer, the process is simplified. Accordingly, the first glass substrate UT1 that includes the protection layer OM and the photoresist layer PR in a portion that corresponds to the non-foldable portions NFP1-W and NFP2-W (see FIG. 6A) is produced. That is, the window WM-1 of FIG. 6A is produced.

Figure 14A:
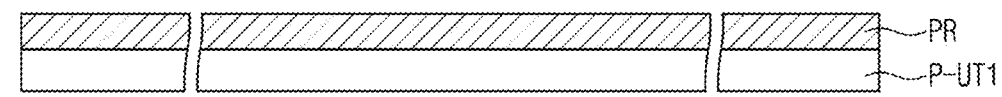
FIG. 14A is a cross-sectional view that illustrates a step of a method of manufacturing an electronic device according to an embodiment of the inventive concept.
Figure 14A:
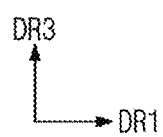
Figure 14B:
FIG. 14B is a cross-sectional view that illustrates a step of a method of manufacturing an electronic device according to an embodiment of the inventive concept.
Figure 14B:
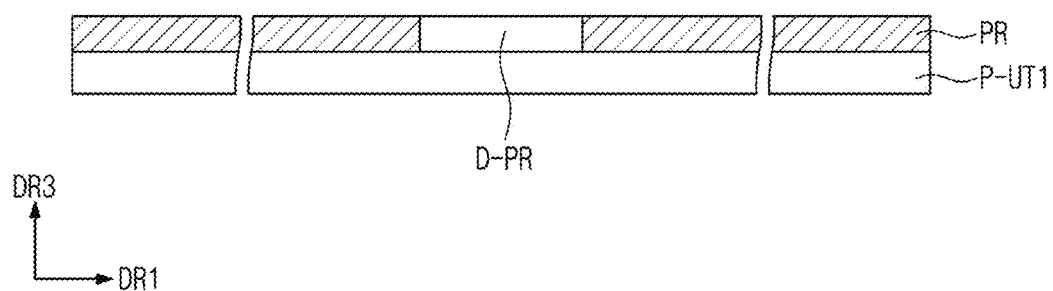
Figure 14B:
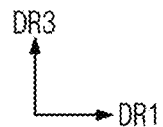

FIG. 14A illustrates disposing a photoresist layer PR on a preliminary first glass substrate P-UT1 (S220-1). FIG. 14B illustrates forming an opening on a photoresist layer PR (S230-1). Referring to FIG. 14A and FIG. 14B, the step S220-1 of disposing the photoresist layer PR on the first glass substrate P-UT1 (S220-1) includes disposing the photoresist layer PR on one entire flat surface of the first glass substrate P-UT1. Forming the opening on the photoresist layer PR (S230-1) includes irradiating light LT on a portion of the photoresist layer PR that corresponds to the foldable portion FP-W (see FIG. 6B). The step (S230-1) further includes removing the photoresist layer D-PR that was irradiated with light LT.

Figure 15:
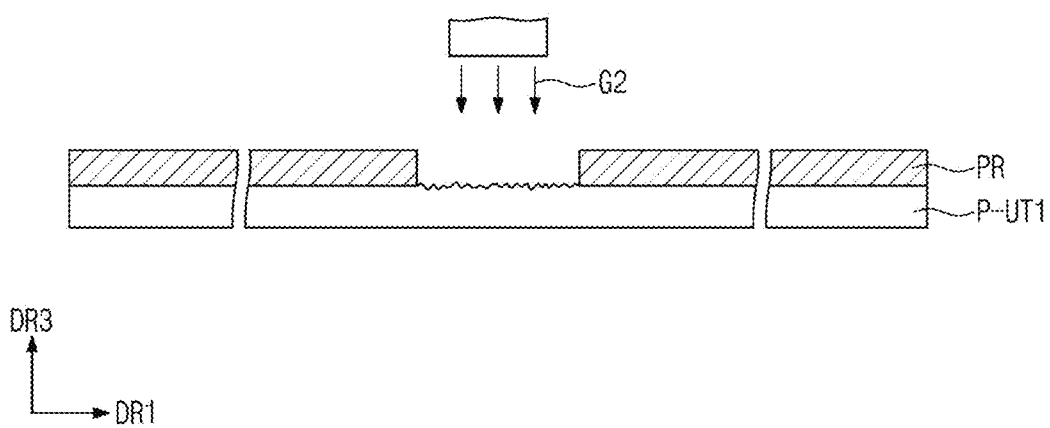
FIG. 15 is a cross-sectional view that illustrates a step of a method of manufacturing an electronic device according to an embodiment of the inventive concept.

FIG. 15 illustrates etching a preliminary first glass substrate exposed by a photoresist layer with a second gas (S240-1). The step S240-1 of etching the preliminary first glass substrate P-UT1 exposed by the photoresist layer PR with the second gas G2 (S240-1) includes removing a portion of the preliminary first glass P-UT1 that corresponds to the foldable portion FP-W (see FIG. 6B) to form the recessed portion CU. For example, the preliminary first glass substrate P-UT1 exposed by the photoresist layer PR is etched with the second gas G2 (S240-1) in a photolithography process. Since a method of manufacturing an electronic device according to an embodiment of the inventive concept includes a photolithography process, the glass substrate P_UT1 is precisely processed. The second gas G2 includes a fluorine-based gas. For example, the second gas G2 includes at least one of $SF_6$, $SF_4$, $CHF_3$, $C_2F_6$, $C_3F_6$, or $C_4F_8$.

Figure 16:
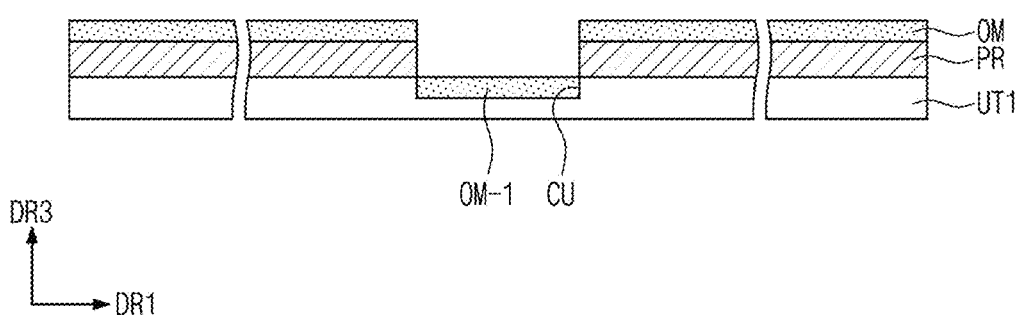
FIG. 16 is a cross-sectional view that illustrates a step of a method of manufacturing an electronic device according to an embodiment of the inventive concept.

FIG. 16 illustrates disposing a protection layer OM on a photoresist layer PR and a first glass substrate UT1 (S250-1). Referring to FIG. 16, the step S250-1 of disposing the protective layer OM-1 on the photoresist layer PR and the first glass substrate UT1 includes disposing the protective layer OM-1 on the photoresist layer PR, which corresponds to the non-foldable portions NFP1-W and NFP2-W (see FIG. 6B), and a portion of the first glass substrate UT1 that corresponds to the foldable portion FP-W (see FIG. 6B). The protective layer OM-1 fills the recessed portion CU formed on the first glass substrate UT1.

Figure 17:
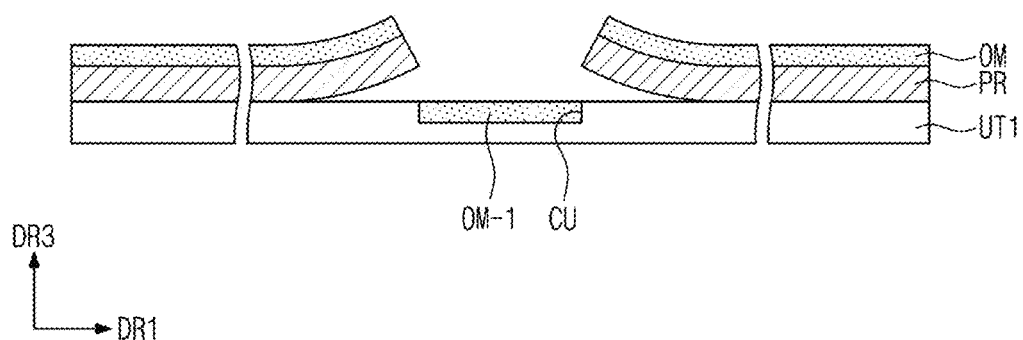
FIG. 17 is a cross-sectional view that illustrates a step of a method of manufacturing an electronic device according to an embodiment of the inventive concept.

FIG. 17 illustrates removing a photoresist layer PR from a first glass substrate UT1 (S260-1). Referring to FIG. 17, the step S260-1 of removing the photoresist layer PR from the first glass substrate UT1 includes removing not only the photoresist layer PR but also the protection layer OM from the first glass substrate UT1. Accordingly, the first glass substrate UT1 that includes the protection layer OM-1 in the recessed portion CU that corresponds to the foldable portion FP-W (see FIG. 6B) is formed.

Figure 18:
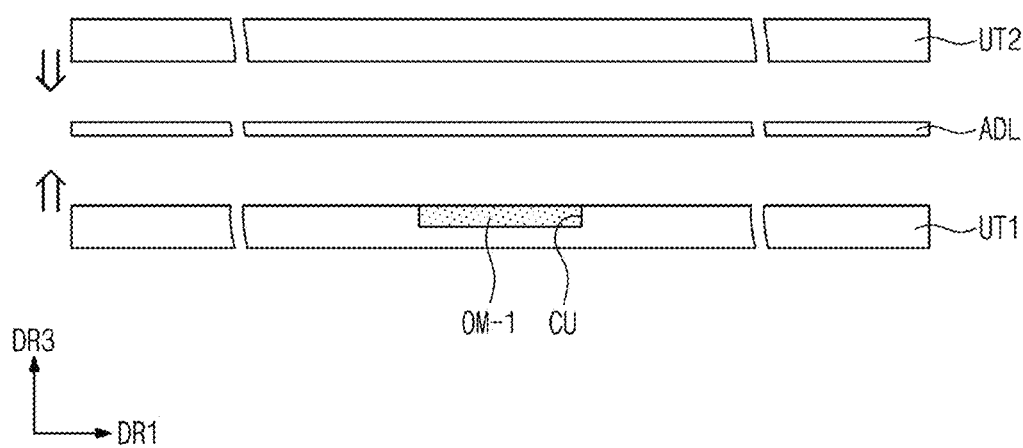
FIG. 18 is a cross-sectional view that illustrates a step of a method of manufacturing an electronic device according to an embodiment of the inventive concept.

FIG. 18 illustrates disposing a second glass substrate UT2 on a first glass substrate UT1 (S270-1). Referring to FIG. 18, the step S270-1 of disposing the second glass substrate UT2 on the first glass substrate UT1 includes disposing the second glass substrate UT2 above the recessed portion CU of the first glass substrate UT1. In addition, the step (S270-1) further includes disposing an adhesive layer ADL between the first glass substrate UT1 and the second glass substrate UT2. Accordingly, the window WM-1 that includes the protection layer OM in a recessed portion of the first glass substrate that corresponds to the foldable portion FP-W (see FIG. 6B) and a second glass substrate is produced.

An electronic device according to an embodiment of the inventive concept includes a first glass substrate that has a recessed portion formed thereon that corresponds to the foldable portion, a second glass substrate that faces the first glass substrate, a protection layer disposed between the first glass substrate and the second glass substrate and that includes an inorganic oxide, and a photoresist layer disposed between the protection layer and the second glass substrate. An electronic device can be folded by including the first glass substrate with the recessed portion that corresponds to the foldable portion. In addition, by including the protection layer and the photoresist layer between the first glass substrate and the second glass substrate, the electronic device is impact resistant.

An electronic device according to an embodiment of the inventive concept exhibits good folding properties and excellent impact resistance by including, above a display module, a window that has a structure in which a plurality of glass substrates are bonded to each other, in which at least one of the plurality of glass substrates has a small thickness in a portion that corresponds to the foldable region as compared to the non-foldable region, and that includes a protection layer disposed between the glass substrates and contains an inorganic oxide.

A method of manufacturing an electronic device according to an embodiment of the inventive concept provides an electronic device that has good folding properties and excellent impact resistance by including a step of providing above a display module a window that has a structure in which a plurality of glass substrates are bonded to each other, in which at least one of the plurality of glass substrates has a small thickness in a portion that corresponds to the foldable region as compared to the non-foldable region, and that includes a protection layer disposed between the glass substrates and contains an inorganic oxide.

Although the above has been described with reference to embodiments of the inventive concept, those skilled in the art or those of ordinary skill in the art will understand that various modifications and changes can be made to embodiments of the inventive concept within the scope that does not depart from the spirit and technical field of embodiments of the inventive concept described in the claims to be described later. Accordingly, the technical scope of embodiments of the inventive concept should not be limited to embodiments described above, but should be determined by the claims described hereinafter.

What is claimed is:

1. An electronic device, comprising:
    a display module that includes a foldable display portion that is foldable with respect to a folding axis that extends in a first direction, and a first non-foldable display portion and a second non-foldable display portion spaced apart from each other in a second direction perpendicular to the first direction with the foldable display portion interposed therebetween; and
    a window disposed above the display module and that includes a foldable portion that corresponds to the foldable display portion and a non-foldable portion that includes a first non-foldable portion and a second non-foldable portion that respectively correspond to the first non-foldable display portion and the second non-foldable display portion, wherein the window comprises:
a first glass substrate;
a second glass substrate disposed on the first glass substrate;
a protection layer that corresponds to the non-foldable portion and that is disposed between the first glass substrate and the second glass substrate and includes an inorganic oxide; and
a photoresist layer disposed between the protection layer and the first glass substrate,
wherein the first glass substrate includes a recessed portion formed on one surface adjacent to the protection layer and that corresponds to the foldable portion.

2. The electronic device of claim 1, wherein the inorganic oxide comprises $Al_2O_3$.

3. The electronic device of claim 1, wherein a thickness of the protection layer is 10000 μm or less.

4. The electronic device of claim 1, wherein a ratio of a transmittance of the protection layer to a transmittance of the first glass substrate is within a range of from 100:99 to 100:101.

5. The electronic device of claim 1, wherein a thickness of a portion of the first glass substrate that corresponds to the foldable portion is about 20 μm to about 100 μm.

6. The electronic device of claim 1, wherein a thickness of a portion of the first glass substrate that corresponds to the non-foldable portion is about 50 μm to about 300 μm.

7. The electronic device of claim 1, wherein a width of a portion that corresponds to the foldable portion in the second direction is about 20 mm or less.

8. The electronic device of claim 1, wherein one surface of the second glass substrate adjacent to the first glass substrate is flat.

9. An electronic device, comprising:
a display module that includes a foldable display portion that is foldable with respect to a folding axis that extends in a first direction, and a first non-foldable display portion and a second non-foldable display portion that are spaced apart from each other in a second direction perpendicular to the first direction with the foldable display portion interposed therebetween; and
a window disposed above the display module and that includes a foldable portion that corresponds to the foldable display portion and a non-foldable portion that includes a first non-foldable portion and a second non-foldable portion that respectively correspond to the first non-foldable display portion and the second non-foldable display portion,
wherein the window comprises:
a first glass substrate disposed on the display module, wherein the first glass substrate includes a first portion that corresponds to the foldable portion and has a first thickness and a second portion that corresponds to the non-foldable portion and has a second thickness greater than the first thickness;
a second glass substrate that facing the first glass substrate; and
a protection layer disposed between the first glass substrate and the second glass substrate, wherein protection layer has a thickness of about 10000 μm or less and includes an inorganic oxide.

10. The electronic device of claim 9, wherein the inorganic oxide comprises $Al_2O_3$.

11. The electronic device of claim 10, wherein the protection layer does not overlap the first portion and overlaps the second portion.

12. The electronic device of claim 10, wherein the window further comprises a photoresist layer disposed on the protection layer.

13. The electronic device of claim 12, wherein the photoresist layer further comprises an adhesive component.

14. The electronic device of claim 10, wherein the protection layer does not overlap the second portion and overlaps the first portion.

15. The electronic device of claim 10, wherein a width of the foldable portion in the second direction is about 20 mm or less.

16. The electronic device of claim 9, wherein:
the first thickness is about 20 μm to about 100 μm; and
the second thickness is about 50 μm to about 300 μm.

17. The electronic device of claim 9, wherein a ratio of a transmittance of the protection layer to a transmittance of the first glass substrate is within a range of from 100:99 to 100:101.

18. A method for manufacturing an electronic device, the method comprising:
providing a display module that includes a foldable display portion that is foldable with respect to a folding axis that extends in a first direction and a first non-foldable display portion and a second non-foldable display portion that are spaced apart from each other in a second direction perpendicular to the first direction with the foldable display portion interposed therebetween; and
disposing a window on the display module, wherein the window includes a foldable portion disposed above the display module and that corresponds to the foldable display portion and a non-foldable portion that includes a first non-foldable portion and a second non-foldable portion that respectively correspond to the first non-foldable display portion and the second non-foldable display portion,
wherein disposing the window comprises:
providing a preliminary first glass substrate;
disposing a protection layer that includes an inorganic oxide on the preliminary first glass substrate;
disposing a photoresist layer on the protection layer;
irradiating light on a portion of the photoresist layer that corresponds to the foldable portion wherein an opening is formed in the photoresist layer;
etching a portion of the protection layer that is exposed by the photoresist layer with a first gas;
etching a portion of the preliminary first glass substrate that is exposed by the photoresist layer with a second gas and producing a first glass substrate; and
disposing a second glass substrate on the photoresist layer.

19. The method of claim 18, wherein the inorganic oxide comprises $Al_2O_3$.

20. The method of claim 18, wherein providing the second glass substrate on the first glass substrate comprises a step in which the photoresist layer bonds the first glass substrate and the second glass substrate to each other.

* * * * *